(12) United States Patent
Kita

(10) Patent No.: US 10,908,386 B2
(45) Date of Patent: Feb. 2, 2021

(54) IMAGE SENSOR AND IMAGE-CAPTURING DEVICE

(71) Applicant: NIKON CORPORATION, Tokyo (JP)

(72) Inventor: Yuki Kita, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 234 days.

(21) Appl. No.: 16/067,165

(22) PCT Filed: Jan. 5, 2017

(86) PCT No.: PCT/JP2017/000145
§ 371 (c)(1),
(2) Date: Nov. 19, 2018

(87) PCT Pub. No.: WO2017/119448
PCT Pub. Date: Jul. 13, 2017

(65) Prior Publication Data
US 2019/0079266 A1    Mar. 14, 2019

(30) Foreign Application Priority Data

Jan. 8, 2016    (JP) .................................. 2016-002729

(51) Int. Cl.
*G01B 9/04* (2006.01)
*G02B 7/34* (2006.01)
(Continued)

(52) U.S. Cl.
CPC ............... *G02B 7/34* (2013.01); *G03B 13/36* (2013.01); *H01L 27/146* (2013.01);
(Continued)

(58) Field of Classification Search
CPC ............... H04N 5/369; H04N 5/36961; H04N 9/04551; H04N 5/3745; H04N 5/232122;
(Continued)

(56) References Cited

U.S. PATENT DOCUMENTS 4,644,406 A    2/1987    Nishigaki et al.
2013/0015547 A1*   1/2013    Hamano ............... H01L 27/307
257/436
(Continued)

FOREIGN PATENT DOCUMENTS

JP    S60-161664 A    8/1985
JP    2010-93071 A    4/2010
(Continued)

OTHER PUBLICATIONS

Feb. 21, 2017 International Search Report issued in International Patent Application No. PCT/JP2017/000145.
(Continued)

*Primary Examiner* — Georgia Y Epps
*Assistant Examiner* — Kevin Wyatt
(74) *Attorney, Agent, or Firm* — Oliff PLC

(57) ABSTRACT

An image sensor includes: a photoelectric conversion film that performs photoelectric conversion on light having entered therein; at least two electrodes, including a first electrode and a second electrode, disposed at a surface of the photoelectric conversion film; and at least two electrodes, including a third electrode and a fourth electrode, disposed at another surface of the photoelectric conversion film.

18 Claims, 21 Drawing Sheets

(51) Int. Cl.
  *H04N 5/3745* (2011.01)
  *H04N 5/369* (2011.01)
  *H04N 5/232* (2006.01)
  *H01L 27/28* (2006.01)
  *H01L 27/146* (2006.01)
  *H01L 27/30* (2006.01)
  *H04N 9/04* (2006.01)
  *G03B 13/36* (2006.01)

(52) U.S. Cl.
  CPC ........ *H01L 27/14667* (2013.01); *H01L 27/28* (2013.01); *H01L 27/307* (2013.01); *H04N 5/232122* (2018.08); *H04N 5/369* (2013.01); *H04N 5/36961* (2018.08); *H04N 5/3745* (2013.01); *H04N 9/04551* (2018.08)

(58) Field of Classification Search
  CPC . H01L 27/28; H01L 27/307; H01L 27/14667; H01L 27/146; G03B 13/36
  USPC ....................................... 250/201.8
  See application file for complete search history.

(56) References Cited

U.S. PATENT DOCUMENTS

2017/0257587 A1    9/2017  Hatano et al.
2020/0021767 A1*   1/2020  Ikedo ................... H01L 31/107

FOREIGN PATENT DOCUMENTS

JP    2012-169584 A    9/2012
JP    2014-67948 A     4/2014
JP    2016-58559 A     4/2016

OTHER PUBLICATIONS

Jul. 23, 2019 Office Action issued in Japanese Patent Application No. 2017-560405.

Mar. 10, 2020 Office Action issued in Japanese Patent Application No. 2017-560405.

* cited by examiner (a)　　　　　　　　　　　(b)

FIG.4
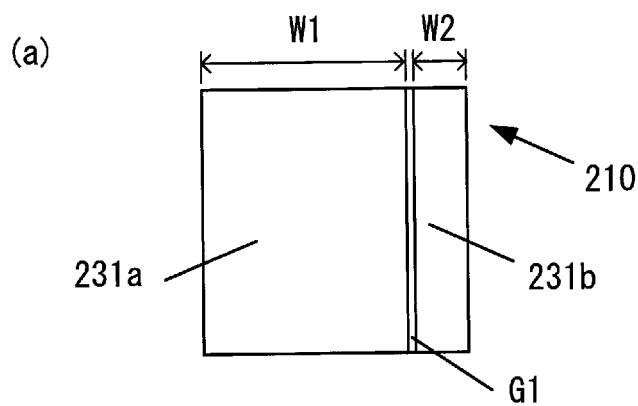
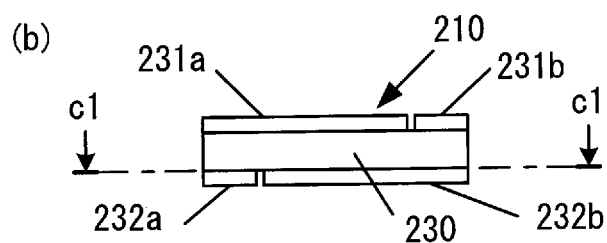
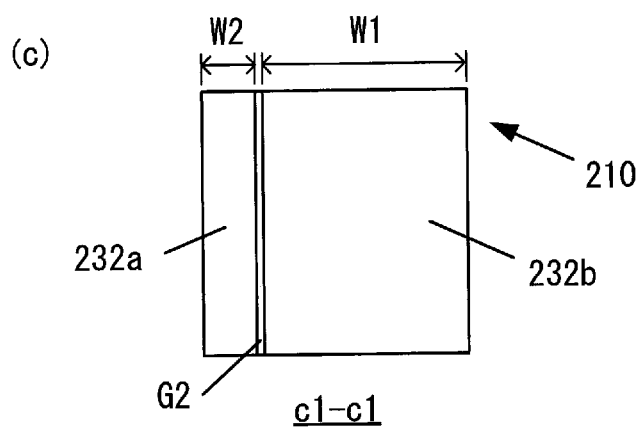

FIG.5
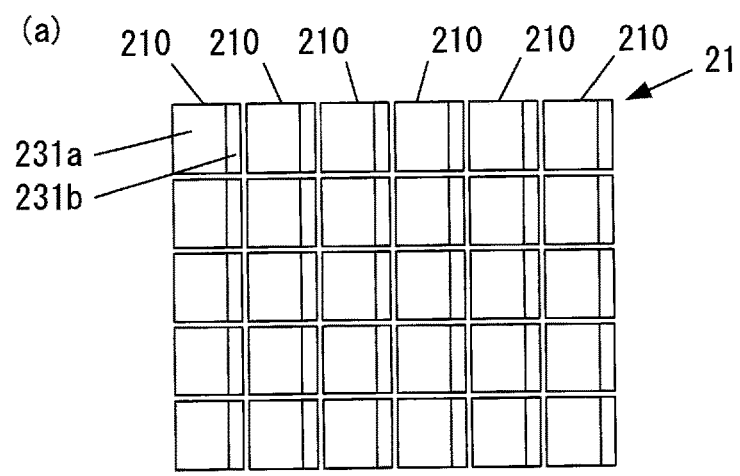
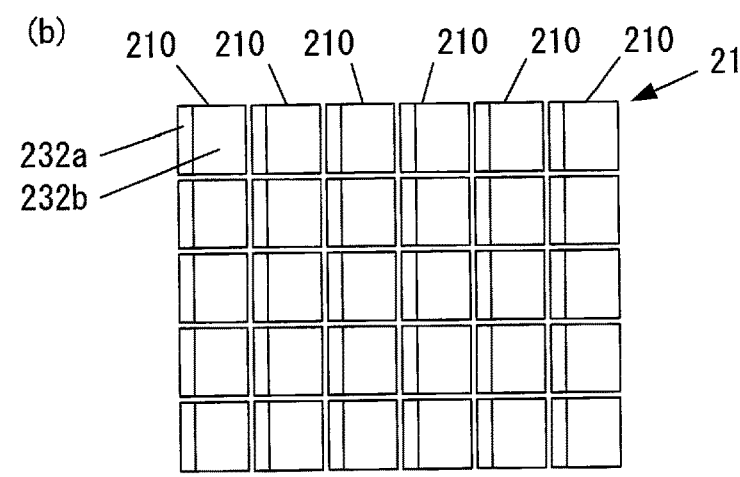
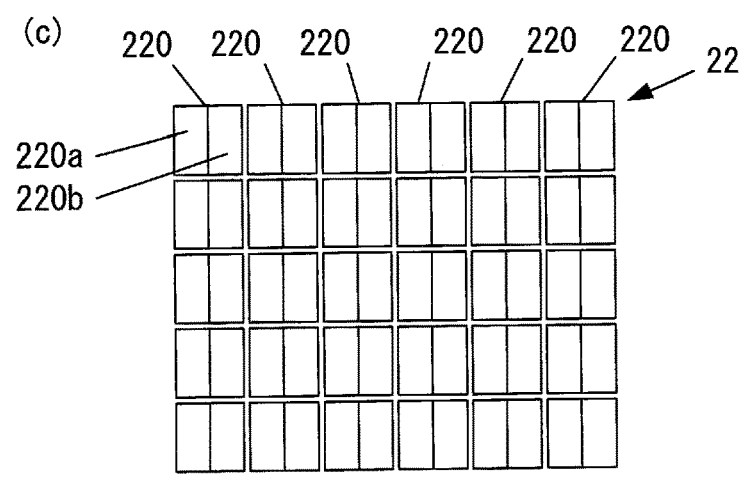

FIG.13
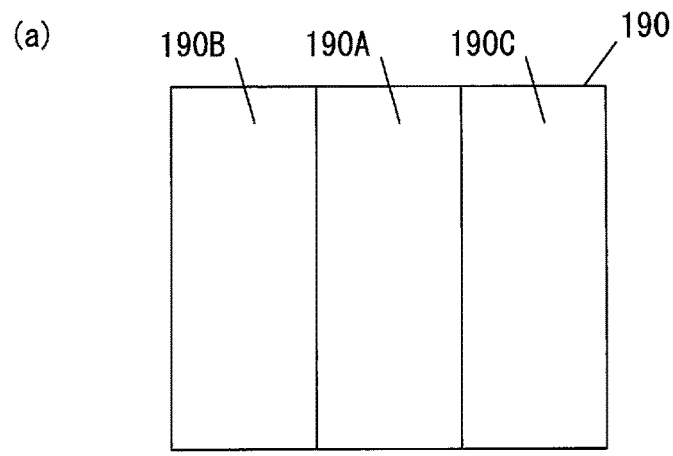
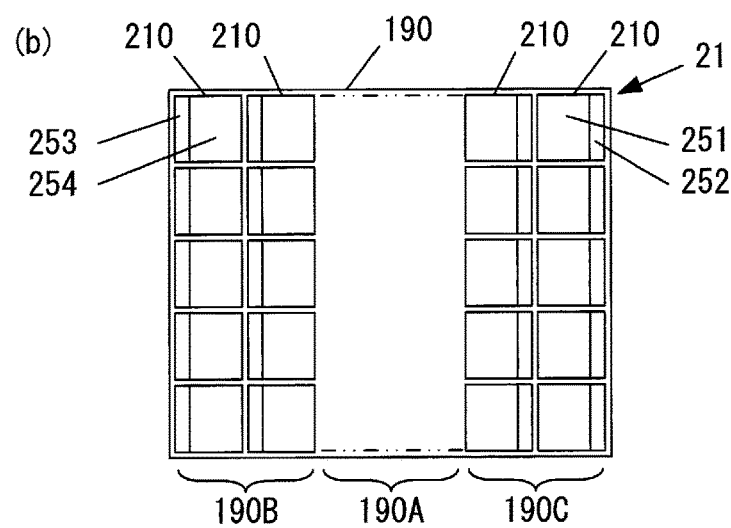
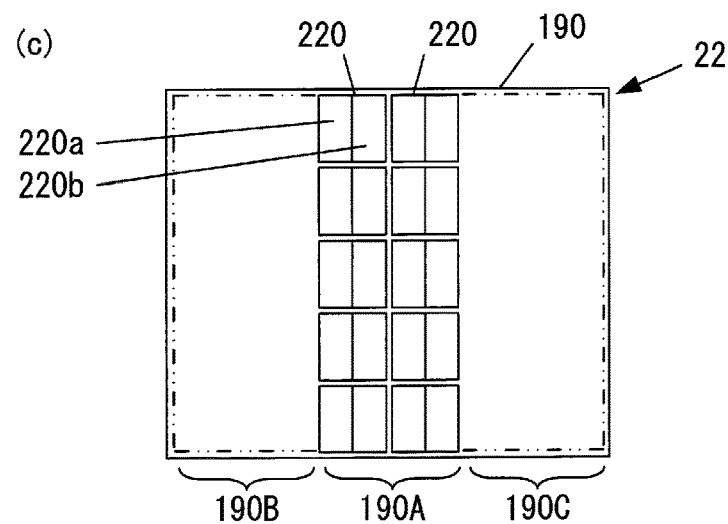

FIG.14
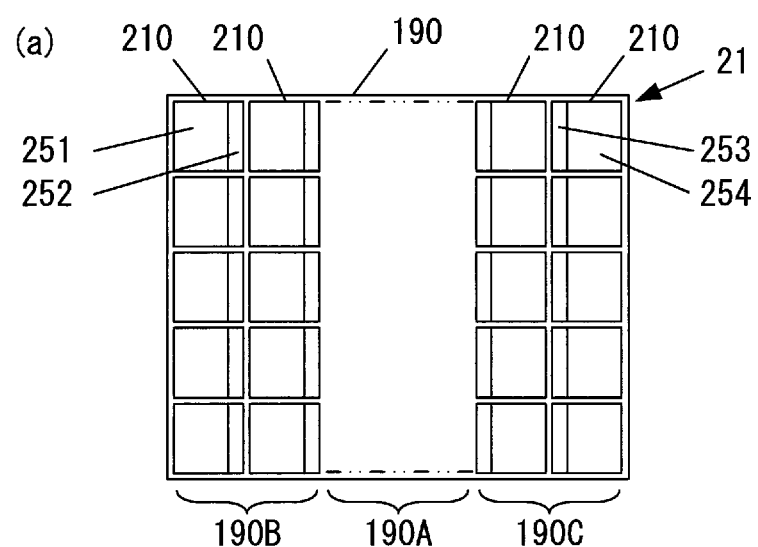
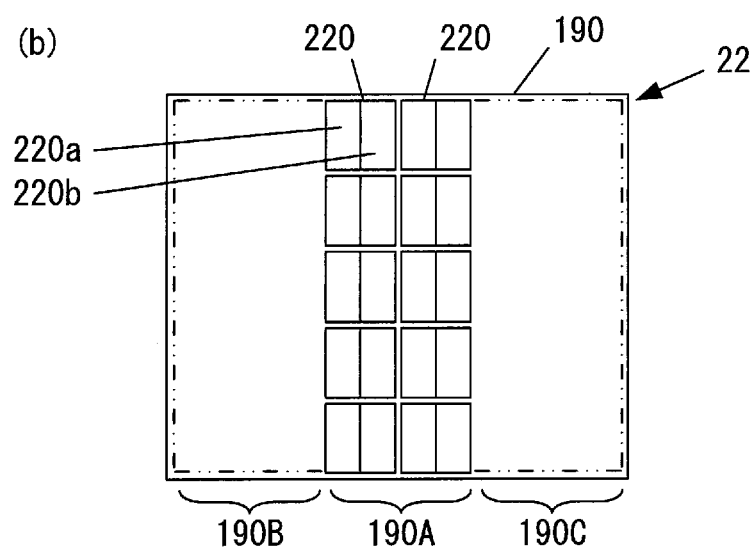

FIG.17
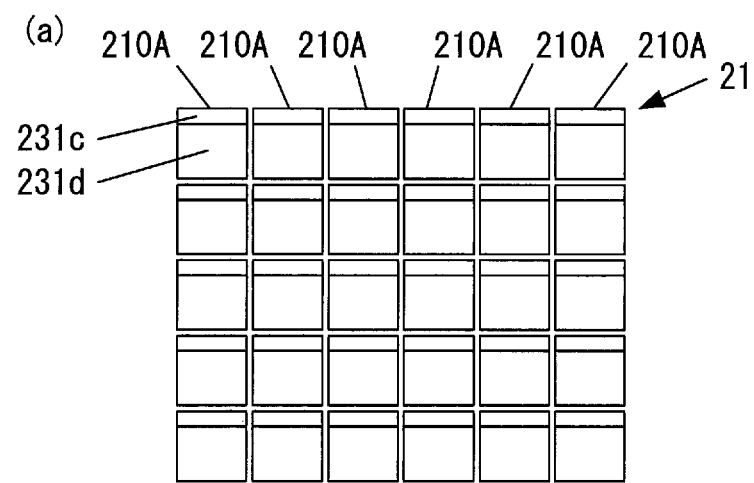
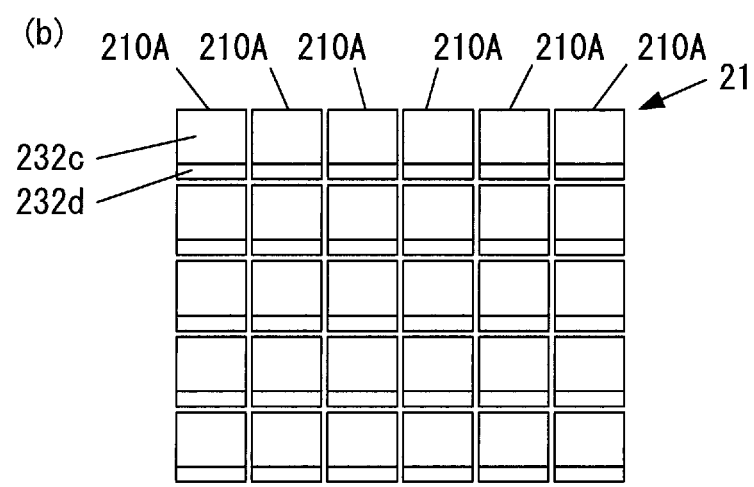
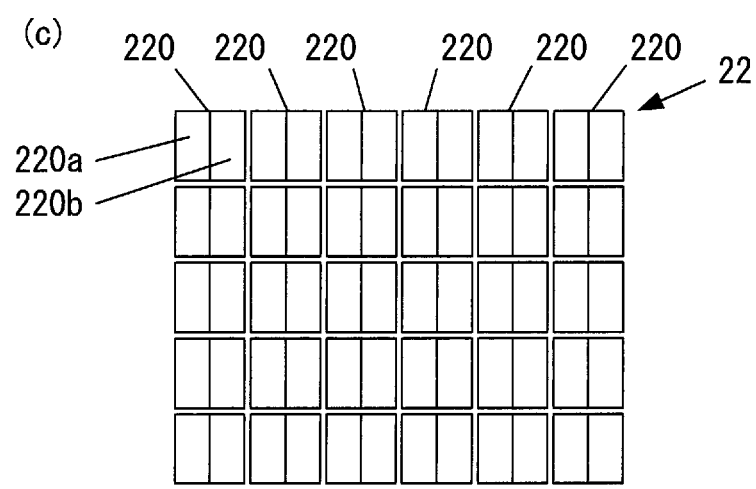

FIG.19
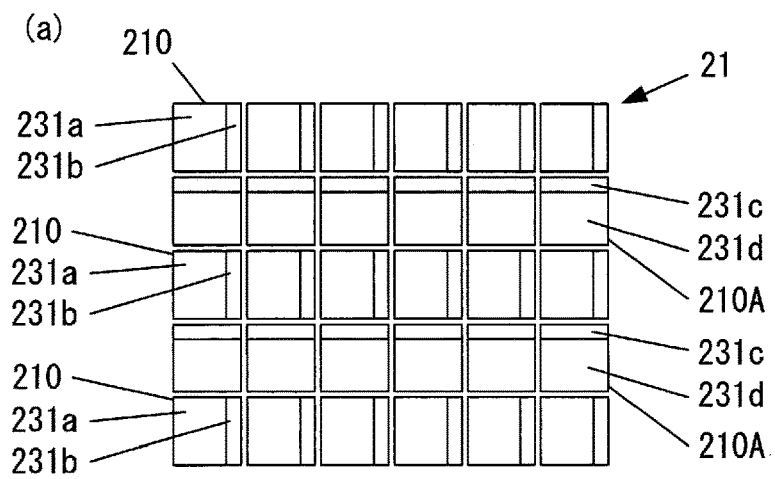
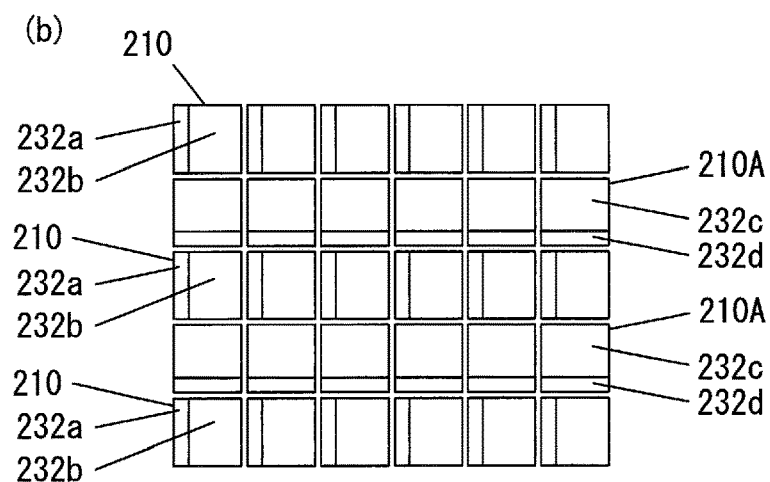
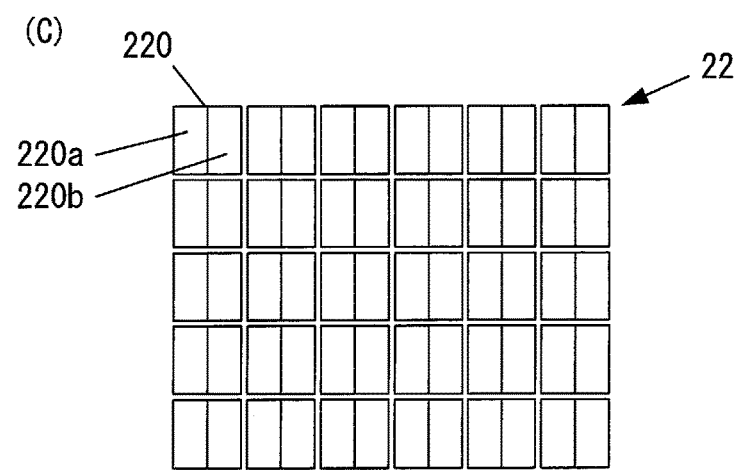

FIG.20
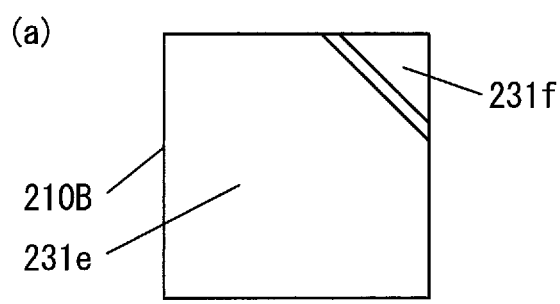
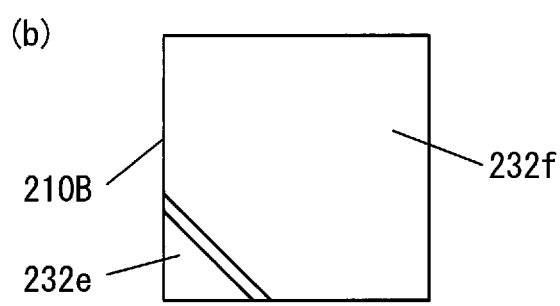

IMAGE SENSOR AND IMAGE-CAPTURING DEVICE

TECHNICAL FIELD

The present invention relates to an image sensor and an image-capturing device.

BACKGROUND ART

Image sensors having disposed therein pixels each of which includes an organic photoelectric conversion film are known in the related art.

The image sensors in the related art, however, are limited in that the size of the light receiving area at each pixel cannot be adjusted.

CITATION LIST

Patent Literature

PTL 1: Japanese Laid Open Patent Publication No. 2014-67948

SUMMARY OF INVENTION

An image sensor according to a first aspect of the present invention comprises: a photoelectric conversion film that performs photoelectric conversion on light having entered therein; at least two electrodes, including a first electrode and a second electrode, disposed at a surface of the photoelectric conversion film; and at least two electrodes, including a third electrode and a fourth electrode, disposed at another surface of the photoelectric conversion film.

According to a second aspect of the present invention, in the image sensor according to the first aspect, it is preferable that a position of a boundary between the first electrode and the second electrode is different from a position of a boundary between the third electrode and the fourth electrode, viewed from a side to which the light enters.

According to a third aspect of the present invention, in the image sensor according to the second aspect, it is preferred to further comprise: an electric charge readout unit that reads out an electric charge generated in the photoelectric film from the first electrode, the second electrode, the third electrode and the fourth electrode.

According to a fourth aspect of the present invention, in the image sensor according to the third aspect, it is preferable that the first electrode overlaps the entire third electrode via the photoelectric conversion film and also overlaps part of the fourth electrode via the photoelectric conversion film; and the second electrode does not overlap the third electrode via the photoelectric conversion film but overlaps part of the fourth electrode via the photoelectric conversion film.

According to a fifth aspect of the present invention, in the image sensor according to the fourth aspect, it is preferable that the electric charge readout unit is able to read out from the first electrode an electric charge generated in an area of the photoelectric conversion film located between the first electrode and the third electrode and between the first electrode and the fourth electrode, is able to read out from the first electrode or the fourth electrode an electric charge generated in an area of the photoelectric conversion film located between the first electrode and the fourth electrode, and is able to read out from the fourth electrode an electric charge generated in an area of the photoelectric conversion film located between the fourth electrode and the first electrode and between the fourth electrode and the second electrode.

According to a sixth aspect of the present invention, in the image sensor according to the fourth or fifth aspect, it is preferable that the electric charge readout unit is able to read out from the second electrode or the fourth electrode an electric charge generated in an area of the photoelectric conversion film located between the second electrode and the fourth electrode, and is able to read out from the first electrode or the third electrode an electric charge generated in an area of the photoelectric conversion film located between the first electrode and the third electrode.

According to a seventh aspect of the present invention, in the image sensor according to any one of the fourth to sixth aspects, it is preferable that the electric charge readout unit is able to read out from the second electrode an electric charge generated in an area of the photoelectric conversion film located between the second electrode and the fourth electrode, while concurrently reading out from the first electrode an electric charge generated in an area of the photoelectric conversion film located between the first electrode and the third electrode and between the first electrode and the fourth electrode.

According to an eighth aspect of the present invention, in the image sensor according to the seventh aspect, it is preferable that the electric charge readout unit is able to read out from the fourth electrode an electric charge generated in an area of the photoelectric conversion film located between the fourth electrode and the first electrode and between the fourth electrode and the second electrode, while concurrently reading out from the third electrode an electric charge generated in an area of the photoelectric conversion film located between the first electrode and the third electrode.

An image-capturing device according to a ninth aspect of the present invention comprises: a first image sensor having arrayed therein a plurality of first pixels, each of the first pixels includes a photoelectric conversion film, a first electrode and a second electrode disposed at a surface of the photoelectric conversion film and a third electrode and a fourth electrode disposed at another surface of the photoelectric conversion film, and receives first and second light fluxes having passed through first and second areas of a pupil of a photographic optical system, and outputs first and second photoelectric conversion signals; a second image sensor having arrayed therein a plurality of second pixels, each of the second pixels receives third and fourth light fluxes having passed through third and fourth areas of the pupil of the photographic optical system and having been transmitted through the first image sensor, and outputs third and fourth photoelectric conversion signals; and a focus detection unit that executes focus detection by using the third and fourth photoelectric conversion signals provided from the second image sensor as focus detection signals corresponding to a central area of a photographic image plane formed via the photographic optical system, and executes focus detection by using the first and second photoelectric conversion signals provided from the first image sensor as focus detection signals corresponding to a peripheral area of the photographic image plane, wherein: at the first image sensor, a first photoelectric conversion area and a second photoelectric conversion area are formed with the first electrode, the second electrode, the third electrode and the fourth electrode in each of the first pixels corresponding to a peripheral area located on one side relative to the central area of the photographic image plane, and a third photoelectric conversion area and a fourth photoelectric conversion area are formed with the first electrode, the second electrode, the third electrode and the fourth electrode in each of the first pixels corresponding to a peripheral area located on another side relative to the central area of the photographic image plane; and at the first image sensor, the first pixels corresponding to the peripheral area located on the one side each output photoelectric conversion signals from the first photoelectric conversion area and the second photoelectric conversion area as the first and second photoelectric conversion signals, and the first pixels corresponding to the peripheral area located on the other side each output photoelectric conversion signals from the third photoelectric conversion area and the fourth photoelectric conversion area as the first and second photoelectric conversion signals.

According to a tenth aspect of the present invention, in the image-capturing device according to the ninth aspect, it is preferable that each of the first pixels in the first image sensor include a microlens, and the first and second light fluxes having passed through the microlens are received at the photoelectric conversion film; a boundary between the first photoelectric conversion area and the second photoelectric conversion area is offset toward one side relative to an optical axis of the microlens and a boundary between the third photoelectric conversion area and the fourth photoelectric conversion area is offset toward another side relative to the optical axis of the microlens at the first image sensor, and each of the second pixels in the second image sensor include a pair of photoelectric conversion units that receive the third and fourth light fluxes, respectively, and a boundary of the pair of photoelectric conversion units is substantially in alignment with the optical axis of the microlens.

According to an eleventh aspect of the present invention, in the image-capturing device according to the tenth aspect, it is preferable that at the first image sensor, the first photoelectric conversion area and the second photoelectric conversion area correspond to the first electrode and the second electrode, and the third photoelectric conversion area and the fourth photoelectric conversion area correspond to the third electrode and the fourth electrode.

According to a twelfth aspect of the present invention, in the image-capturing device according to the tenth or eleventh aspect, it is preferable that if an exit pupil position at the photographic optical system is set at a first predetermined position relative to a focus detection pupil position, the focus detection unit executes focus detection by using the third and fourth photoelectric conversion signals provided from the second image sensor in the peripheral area of the photographic image plane as well as in the central area of the photographic image plane.

According to a thirteenth aspect of the present invention, in the image-capturing device according to any one of the tenth to twelfth aspects, it is preferable that if an exit pupil position at the photographic optical system is set at a second predetermined position relative to a focus detection pupil position, at the first image sensor, the first photoelectric conversion area and the second photoelectric conversion area are formed with the first electrode, the second electrode, the third electrode and the fourth electrode in each of the first pixels corresponding to the peripheral area located on the one side, and the third photoelectric conversion area and the fourth photoelectric conversion area are formed with the first electrode, the second electrode, the third electrode and the fourth electrode in each of the first pixels corresponding to the peripheral area located on the other side; and if the exit pupil position at the photographic optical system is set at a third predetermined position relative to the focus detection pupil position, at the first image sensor, the third photoelectric conversion area and the fourth photoelectric conversion area are formed with the first electrode, the second electrode, the third electrode and the fourth electrode in each of the first pixels corresponding to the peripheral area located on the one side, and the first photoelectric conversion area and the second photoelectric conversion area are formed with the first electrode, the second electrode, the third electrode and the fourth electrode in each of the first pixels corresponding to the peripheral area located on the other side.

BRIEF DESCRIPTION OF DRAWINGS

FIG. 4($a$) shows a plan view of a pixel in the first image sensor, viewed from the subject side, FIG. 4($b$) is a side elevation, and FIG. 4($c$) is a sectional view through c1-c1 in (b).

FIGS. 5($a$) and 5($b$) show schematic illustrations of the structure of pixels in the first image sensor, FIG. 5($c$) shows a schematic illustration of the structure of pixels in the second image sensor.

FIG. 13 shows illustrations of a condition assumed when the exit pupil distance dn at the photographic optical system is smaller than the focus detection pupil distance d.

FIG. 14 shows illustrations of a condition assumed when the exit pupil distance df at the photographic optical system is greater than the focus detection pupil distance d.

FIG. 17 shows illustrations of a variation.

FIG. 19 shows illustrations of a variation.

FIG. 20 shows illustrations of a variation.

DESCRIPTION OF EMBODIMENTS

Figure 1:
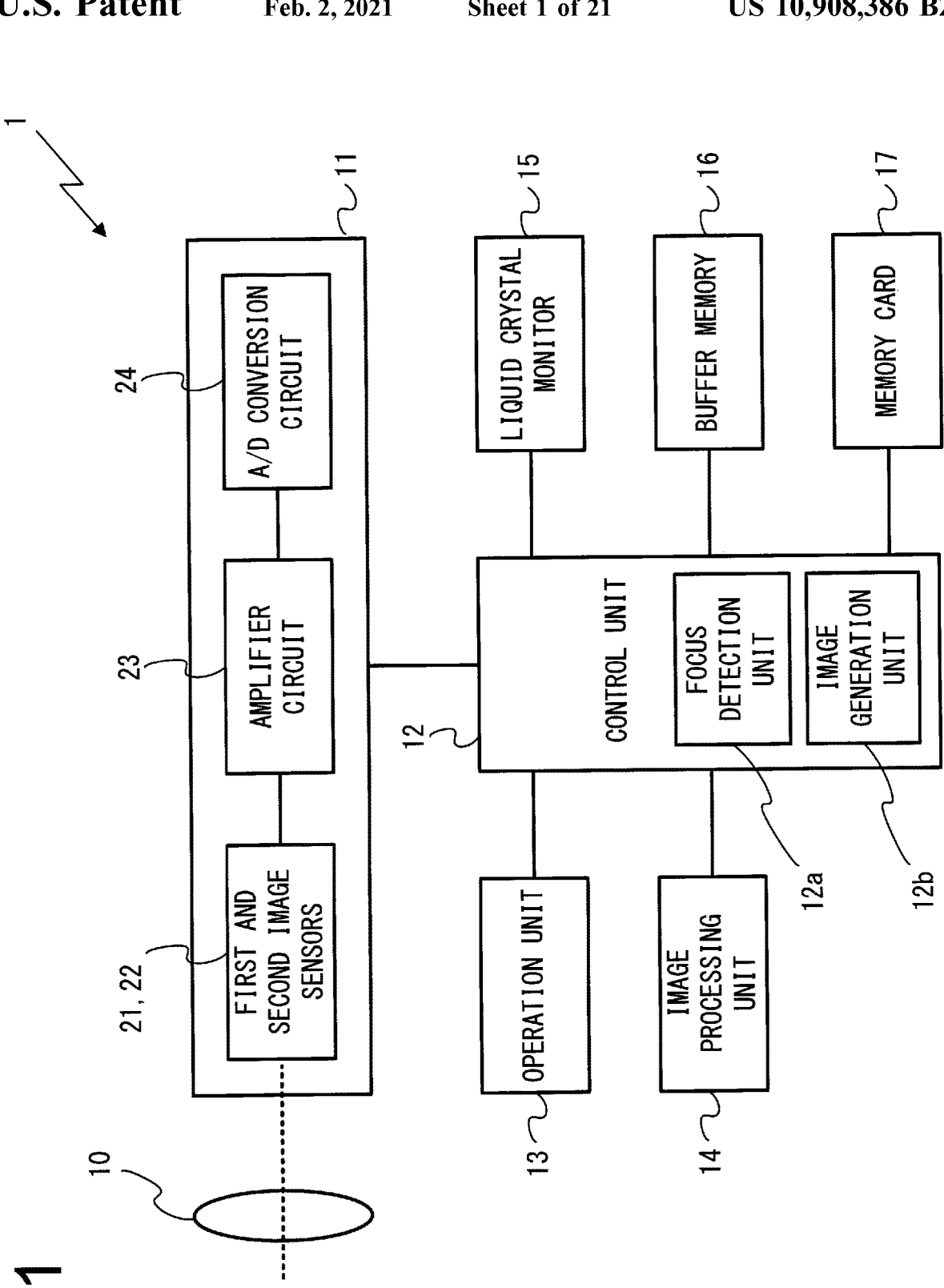
FIG. 1 is a diagram presenting an example of a structure that is adopted in a digital camera achieved in an embodiment.

FIG. 1 is a diagram presenting a structural example for a digital camera 1 achieved in an embodiment of the present invention. The digital camera 1 includes a photographic optical system 10, an image-capturing unit 11, a control unit 12, an operation unit 13, an image processing unit 14, a liquid crystal monitor 15 and a buffer memory 16. In addition, a memory card 17 is loaded in the digital camera 1. The memory card 17, constituted with a non-volatile flash memory or the like, can be detachably loaded into the digital camera 1.

The photographic optical system 10, configured with a plurality of lenses, forms a subject image onto the image-capturing surface of the image-capturing unit 11. The plurality of lenses constituting the photographic optical system 10 includes a focusing lens that is driven along the optical axis for purposes of focus adjustment. The focusing lens is driven along the optical axis by a lens drive unit (not shown).

The image-capturing unit 11 includes a first image sensor 21 and a second image sensor 22 laminated one on top of the other, an amplifier circuit 23 and an A/D conversion circuit 24. The first and second image sensors 21 and 22, each constituted with a plurality of pixels disposed in a two-dimensional pattern, receive light from a photographic subject via the photographic optical system 10 and output photoelectric conversion signals resulting from photoelectric conversion of the light received therein. As will be described in detail later, the pixels in the first and second image sensors 21 and 22 each output an analog photoelectric conversion signals. These photoelectric conversion signals are then used as signals for focus detection executed through the phase detection method and also as signals for photographic image generation, as will be explained later. The amplifier circuit 23 amplifies the photoelectric conversion signals at a predetermined amplification factor (gain) and outputs the resulting signals to the A/D conversion circuit 24. The photoelectric conversion signals undergo A/D conversion at the A/D conversion circuit 24.

The control unit or controller 12, constituted with a microprocessor and its peripheral circuits, executes various types of control for the digital camera 1 by executing a control program installed in a ROM (not shown). In addition, the control unit 12 includes a focus detection unit 12a and an image generation unit 12b in the form of functional units. These functional units are provided in software by means of the control program mentioned above. It is to be noted that the functional units may instead be constituted as electronic circuits.

The control unit 12 stores the photoelectric conversion signals resulting from the A/D conversion at the A/D conversion circuit 24 into the buffer memory 16. The focus detection unit 12a detects the focusing condition at the photographic optical system 10, individually based upon the photoelectric conversion signals stored in the buffer memory 16, which have originated at the first image sensor 21, and based upon the photoelectric conversion signals stored in the buffer memory 16, which have originated at the second image sensor 22. The image generation unit 12b generates image signals by using the photoelectric conversion signals having originated at the second image sensor 22 and stored in the buffer memory 16.

The image processing unit 14 may be constituted with, for instance, an ASIC. The image processing unit 14 generates image data by executing various types of image processing, such as interpolation processing, compression processing and white balance processing, on the image signals provided from the image generation unit 12b. The image data thus generated are brought up on display at the liquid crystal monitor 15 and stored into the memory card 17.

The operation unit 13, constituted with various types of operation members including a shutter release operation member, a mode selection operation member, a focus detection area setting operation member and a power on/off operation member, is operated by the photographer. The operation unit 13 outputs an operation signal, which corresponds to an operation performed by the photographer at an operation member among the operation members listed above, to the control unit 12.

(Description of the First and Second Image Sensors 21 and 22)

Figure 2:
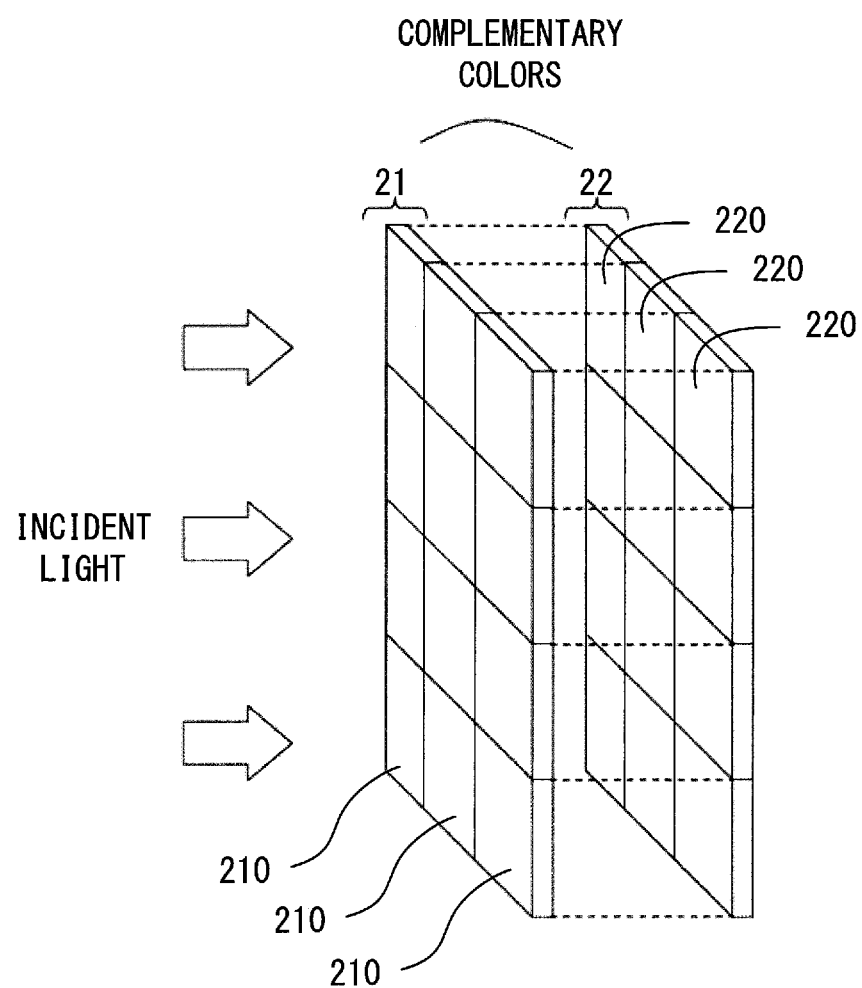
FIG. 2 shows an overview of first and second image sensors.

FIG. 2 provides an overview of the first and second image sensors 21 and 22 achieved in the embodiment. The first image sensor 21 includes photoelectric conversion units each constituted with an organic photoelectric conversion film, whereas the second image sensor 22 includes photoelectric conversion units each constituted with a photodiode formed at a semiconductor substrate. The first image sensor 21 is laminated on the second image sensor 22, and the first and second image sensors 21 and 22 are disposed in the optical path of the photographic optical system 10 so that the optical axis of the photographic optical system 10 shown in FIG. 1 passes through the centers of the image-capturing surfaces of the first and second image sensors 21 and 22. It is to be noted that while FIG. 2 shows pixels 210 and 220 disposed over a range of 4 rows×3 columns at the first and second image sensors 21 and 22 so as to simplify the illustration, pixels are disposed over m rows×n columns at each of the first image sensor 21 and the second image sensor 22 and the size of the pixels in the first image sensor 21 matches the size of the pixels in the second image sensor 22 in the embodiment.

The pixels 210 in the first image sensor 21 each include an organic photoelectric conversion film that absorbs (or performs photoelectric conversion on) a predetermined color component of light. Color components of the light that have not been absorbed (that have not undergone photoelectric conversion) at the first image sensor 21, are transmitted through the first image sensor 21, and enter the second image sensor 22 to undergo photoelectric conversion at the second image sensor 22. It is to be noted that the color component of the light that undergoes photoelectric conversion at the first image sensor 21 and the color component of the light that undergoes photoelectric conversion at the second image sensor 22 are complementary to each other. To describe this in further detail, a given pixel 210 at the first image sensor 21 corresponds to a pixel 220 at the second image sensor 22, disposed at a position directly behind the pixel 210, i.e., the pixels 210 at the first image sensor 21 each correspond to a pixel 220 at the second image sensor 22, which receives the light having passed through the particular pixel 210, and at the pixels 210 and 220 in the first and second image sensors 21 and 22 that correspond to each other as described above, light having complementary color components are absorbed and undergo photoelectric conversion.

Figure 3:
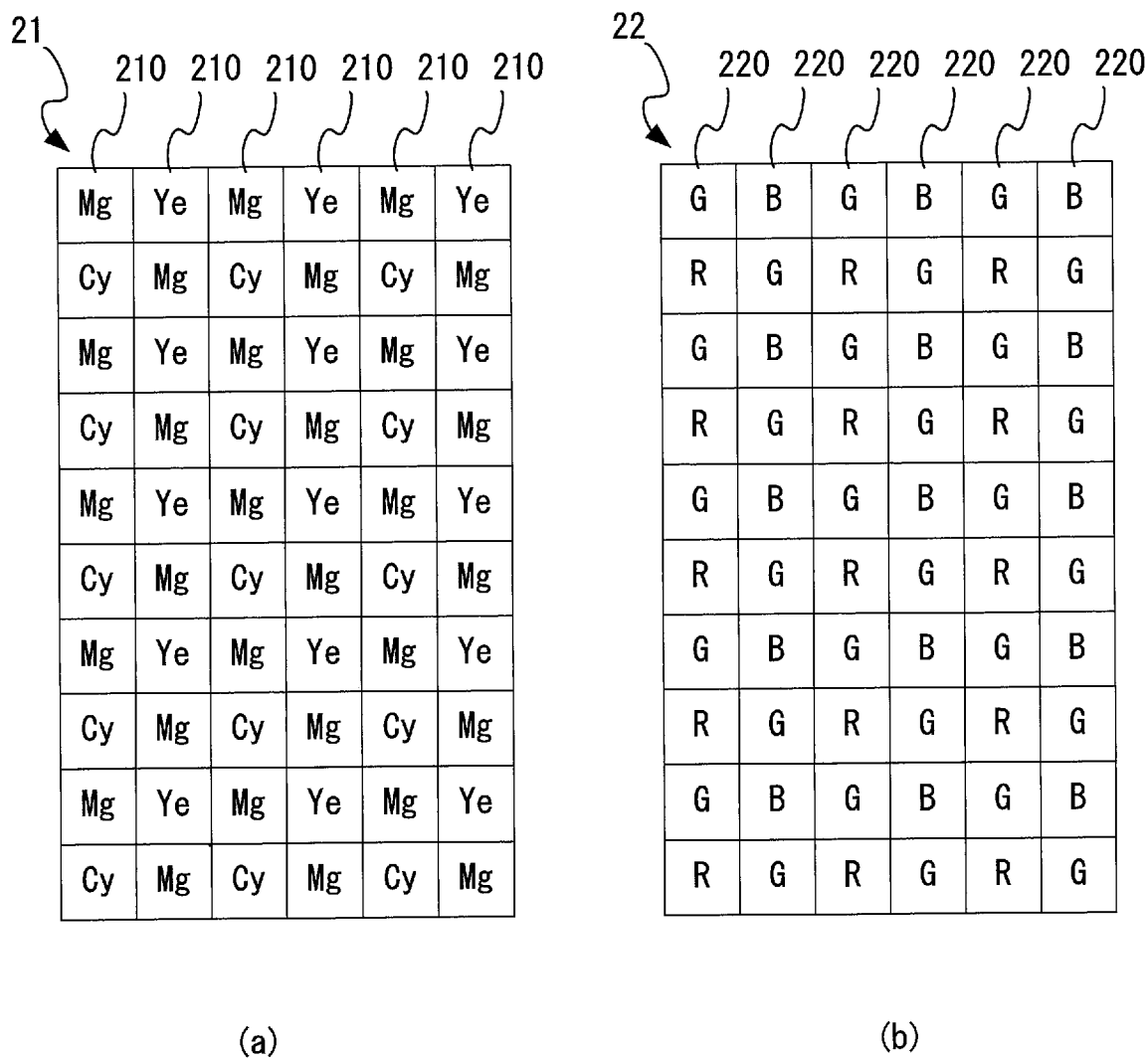
FIG. 3($a$) is a diagram indicating the positional arrangement with which pixels are disposed over a range of 10 rows×6 columns at part of the first image sensor, and FIG. 3($b$) is a diagram indicating the positional arrangement with which pixels are disposed over a range of 10 rows×6 columns at part of the second image sensor.

In FIG. 3, the positional arrangement with which pixels 210 are disposed over a range of 10 rows×6 columns in part of the first image sensor 21 and the positional arrangement with which pixels 220 are disposed over a range of 10 rows×6 columns at part of the second image sensor 22 are individually illustrated. In the first image sensor 21 in FIG. 3(a), each pixel 210 marked "Mg" is a pixel at which light with a magenta color component is absorbed and undergoes photoelectric conversion, i.e., a pixel having magenta spectral sensitivity. Likewise, each pixel 210 marked "Ye" is a pixel at which light with a yellow color component is absorbed and undergoes photoelectric conversion, i.e., a pixel having yellow spectral sensitivity, and each pixel 210 marked "Cy" is a pixel at which light with a cyan color component is absorbed and undergoes photoelectric conversion, i.e., a pixel having cyan spectral sensitivity. In the first image sensor 21, the pixel positions in each odd-numbered row are alternately taken up by an "Mg" pixel 210 and a "Ye" pixel 210 and the pixel positions in each even-numbered row are alternately taken up by a "Cy" pixel 210 and an "Mg" pixel 210.

In the second image sensor 22 in FIG. 3(b), each pixel 220 marked "G" is a pixel at which light with a green color component is absorbed and undergoes photoelectric conversion, i.e., a pixel having green spectral sensitivity. Likewise, each pixel 220 marked "B" is a pixel at which light with a blue color component is absorbed and undergoes photoelectric conversion, i.e., a pixel having blue spectral sensitivity, and each pixel 220 marked "R" is a pixel at which light with a red color component is absorbed and undergoes photoelectric conversion, i.e., a pixel having red spectral sensitivity. In the second image sensor 22, the pixel positions in each odd-numbered row are alternately taken up by a "G" pixel 220 and a "B" pixel 220 and the pixel positions in each even-numbered row are alternately taken up by an "R" pixel 220 and a "G" pixel 220. Namely, the pixels are disposed in a Bayer array at the second image sensor 22.

In FIGS. 3(a) and 3(b), the "Mg" pixels 210 in the first image sensor 21 each correspond to one of the "G" pixels 220 in the second image sensor 22, the "Ye" pixels 210 in the first image sensor 21 each correspond to one of the "B" pixels 220 in the second image sensor 22, and the "Cy" pixels 210 in the first image sensor 21 each correspond to one of the "R" pixels 220 in the second image sensor 22.

As described above, the first image sensor 21, which includes organic photoelectric conversion films, fulfils a function of color filters for the second image sensor 22, and a color image (a Bayer array image in the example presented in FIG. 3), which is complementary to the color image provided via the first image sensor 21, is obtained from the second image sensor 22. This means that a CMY image, composed with the three colors, Cy, Mg and Ye, can be obtained from the first image sensor 21, whereas an RGB image composed with the three colors R, G and B can be obtained from the second image sensor 22.

FIG. 4 and FIGS. 5(a) and 5(b) schematically illustrate the structure of the pixels 210 in the first image sensor 21. FIG. 4(a) shows a pixel 210 in the image sensor 21 in a plan view, taken from the subject side, FIG. 4(b) is a side elevation of the pixel 210 viewed at a side surface thereof and FIG. 4(c) is a sectional view taken through c1-c1 in FIG. 4(b). The pixels 210 in the first image sensor 21 each include an organic photoelectric conversion film 230 that absorbs light with the magenta color component, the yellow color component or the cyan color component, transparent first and second partial electrodes 231a and 231b formed on the upper surface of the organic photoelectric conversion film 230, i.e., on the surface of the organic photoelectric conversion film 230 located toward the subject, and transparent third and fourth partial electrodes 232a and 232b formed on the lower surface of the organic photoelectric conversion film 230.

The first and the second partial electrodes 231a and 231b are disposed along the direction in which the pixels 210 are disposed in a row, as shown in FIG. 5(a), i.e., along the left/right direction in FIGS. 4(a) and 4(b). Likewise, the third and fourth partial electrodes 232a and 232b are disposed along the direction in which the pixels 210 are disposed in a row, i.e., along the left/right direction in FIG. 4(c). The length of the first partial electrode 231a, measured along the row direction, and the length of the second partial electrode 231b measured along the row direction are different from each other. The length W1 of the first partial electrode 231a located on the left side in the figures measured along the row direction, is greater than the length W2 of the second partial electrode 231b located on the right side in the figures, measured along the row direction. Likewise, the length of the third partial electrode 232a, measured along the row direction, and the length of the fourth partial electrode 232b measured along the row direction are different from each other. The length W2 of the third partial electrode 232a located on the left side in the figures measured along the row direction is smaller than the length W1 of the fourth partial electrode 232b located on the right side in the figures, measured along the row direction. In other words, viewed from the side on which light enters, the position of a separation area G1 separating the first partial electrode 231a from the second partial electrode 231b, i.e., the position of the boundary, is different from the position of a separation area G2, i.e., the position of the boundary separating the third partial electrode 232a from the fourth partial electrode 232b. It is to be noted that the length W1 of the first partial electrode 231a measured along the row direction matches the length W1 of the fourth partial electrode 232b measured along the row direction, and the length W2 of the second partial electrode 231b measured along the row direction matches the length W2 of the third partial electrode 232a measured along the row direction.

Thus, the first partial electrode 231a overlaps, along the optical axis, the entire third partial electrode 232a and part of the fourth partial electrode 232b located further to the left in the figures. The entire second partial electrode 231b overlaps, along the optical axis, the fourth partial electrode 232b. The entire third partial electrode 232a overlaps, along the optical axis, the first partial electrode 231a. The fourth partial electrode 232b overlaps, along the optical axis, part of the first partial electrode 231a located further to the right in the figures and the entire second partial electrode 231b. In the following description, the first and second partial electrodes 231a and 231b formed at the upper surface of the organic photoelectric conversion film 230 may also be referred to as upper partial electrodes 231a and 231b and the third and fourth partial electrodes 232a and 232b formed at the lower surface of the organic photoelectric conversion film 230 may also be referred to as lower partial electrodes 232a and 232b.

In each pixel 210 structured as described above, an area from which an electric charge is to be read out from the organic photoelectric conversion film 230 can be set by selecting a specific combination of partial electrodes among the upper partial electrodes 231a and 231b and the lower partial electrode 232a and 232b.

Next, the positional relationship of the partial electrodes in each pixel 210 at the first image sensor 21 to first and second photoelectric conversion units in the corresponding pixel 220 at the second image sensor 22 will be explained. FIG. 5(a) schematically illustrates the positions of the first and second partial electrodes 231a and 231b at the individual pixels 210 in the first image sensor 21 viewed from the subject side, whereas FIG. 5(b) schematically illustrates the positions of the third and fourth partial electrodes 232a and 232b at the individual pixels 210 in the first image sensor 21 viewed from the subject side. FIG. 5(c) schematically illustrates the position of first and second photoelectric conversion units 220a and 220b at the individual pixels 220 in the second image sensor 22 viewed from the subject side. It is to be noted that FIG. 5 only shows pixels 210 and 220 disposed in the first and second image sensors 21 and 22 respectively over a range of 5 rows×6 columns, in order to simplify the illustrations.

As explained earlier, the pixels 210 in the first image sensor 21 in FIGS. 5(a) and 5(b) each include the first and second partial electrodes 231a and 231b disposed side-by-side along the row direction and the third and fourth partial electrodes 232a and 232b also disposed side-by-side along the row direction, i.e., along the left/right direction in FIGS. 5(a) and 5(b). The pixels 220 in the second image sensor 22 shown in FIG. 5(c) each include the first and second photoelectric conversion units 220a and 220b. The first and second photoelectric conversion units 220a and 220b are disposed side-by-side along the row direction, i.e. along the left/right direction in FIG. 5(c). The first and second photoelectric conversion units 220a and 220b have identical shapes and matching sizes. Namely, the length of the first photoelectric conversion unit 220a measured along the row direction is equal to the corresponding length of the second photoelectric conversion unit 220b.

Figure 6:
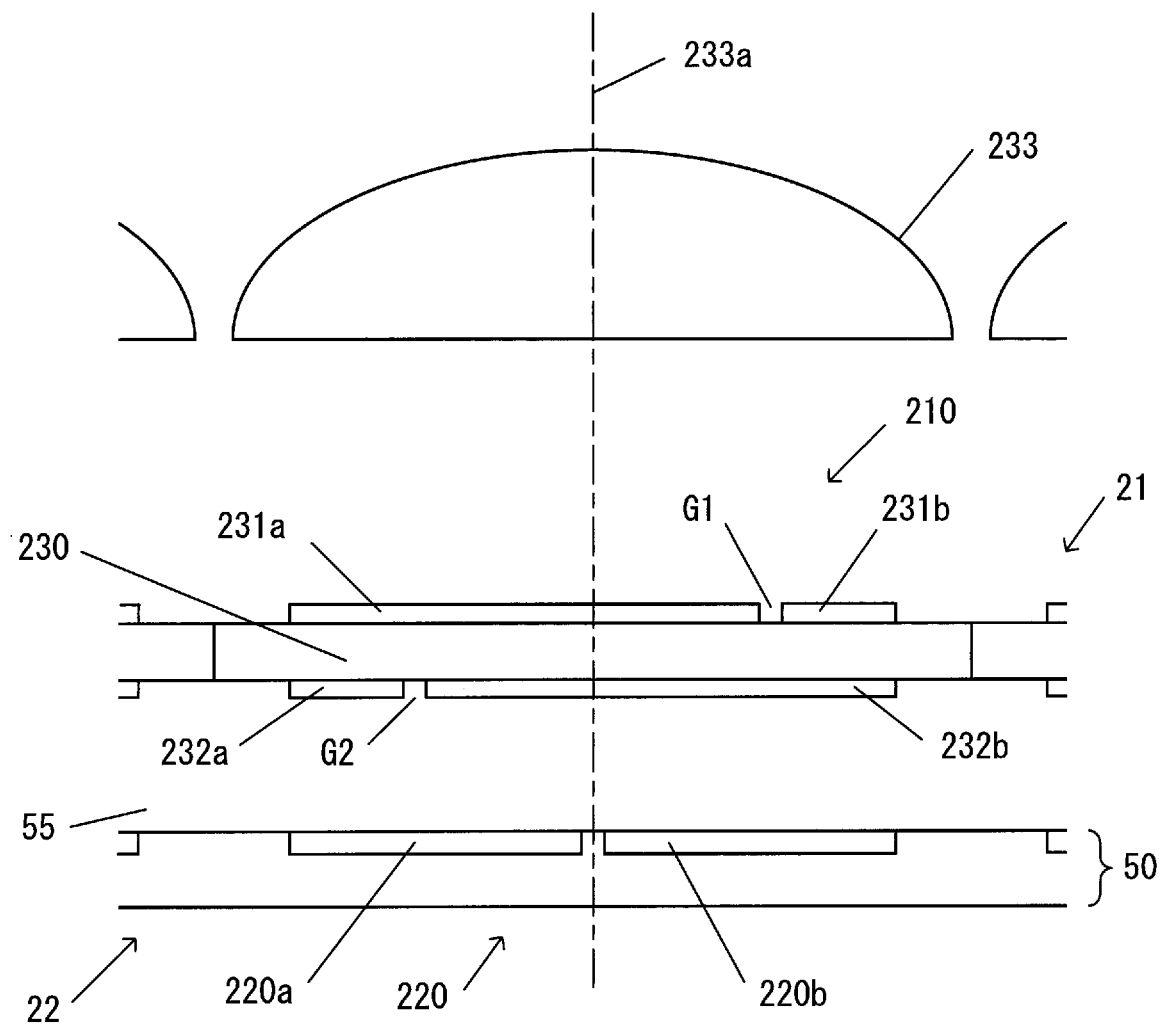
FIG. 6 is a sectional view showing the structure of a pixel in the first image sensor and the structure of a pixel in the second image sensor.

FIG. 6 shows a pixel 210 and a pixel 220 in the first and second image sensors 21 and 22 in a sectional view. As FIG. 6 indicates, the second image sensor 22 is formed on a semiconductor substrate 50, and the pixels 220 each include a first photoelectric conversion unit 220a and a second photoelectric conversion unit 220b set side-by-side along the left/right direction on the drawing sheet. At the surface, i.e., the upper surface, of the second image sensor 22, the first image sensor 21 is laminated via a planarization layer 55. A wiring layer (not shown) is formed inside the planarization layer 55.

In addition, a microlens 233 is disposed above each of the pixels 210 in the first image sensor 21, and the microlens 233, the corresponding pixel 210 in the first image sensor 21 and the corresponding pixel 220 in the second image sensor 22 are disposed in an orderly alignment along the optical axis of the microlens 233.

The first and second photoelectric conversion units 220a and 220b in the second image sensor 22 are set at positions achieving symmetry relative to an optical axis 233a of the microlens 233. However, the boundary G1 of the upper partial electrodes 231a and 231b and the boundary G2 of the lower partial electrodes 232a and 232b in the first image sensor 21 are offset in opposite directions relative to the optical axis 233a of the microlens 233.

Figure 7:
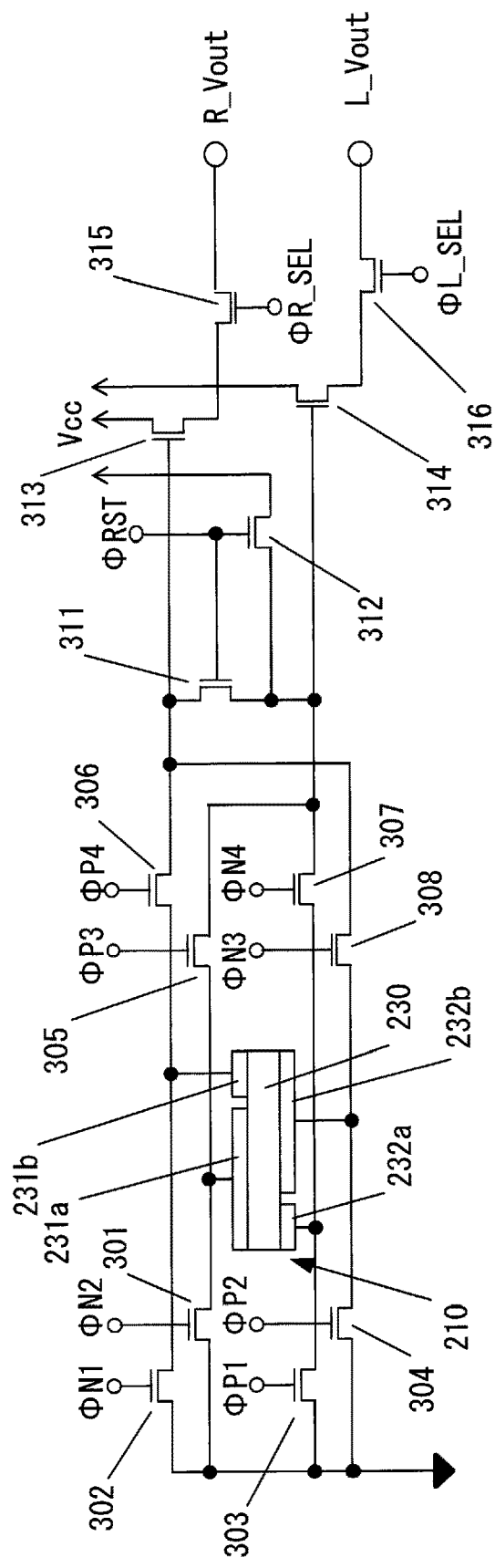
FIG. 7 is a diagram presenting a structural example that may be adopted for the signal readout circuit at a pixel in the first image sensor.

FIG. 7 presents an example of a circuit structure that may be adopted in the signal readout circuit for a pixel 210 in the first image sensor 21. The pixel 210 includes the organic photoelectric conversion film 230, the first and second partial electrodes 231a and 231b and the third and fourth partial electrodes 232a and 232b. The signal readout circuit for each pixel 210 includes electrode selector transistors 301 through 308, reset transistors 311 and 312, output transistors 313 and 314 and row selector transistors 315 and 316. The first partial electrode 231a is connected to the ground via the electrode selector transistor 301, the second partial electrode 231b is connected to the ground via the electrode selector transistor 302, the third partial electrode 232a is connected to the ground via the electrode selector transistor 303, and the fourth partial electrode 232b is connected to the ground via the electrode selector transistor 304.

The first partial electrode 231a and the gate of the output transistor 314 are connected via the electrode selector transistor 305, the second partial electrode 231b and the gate of the output transistor 313 are connected via the electrode selector transistor 306, the third partial electrode 232a and the gate of the output transistor 314 are connected via the electrode selector transistor 307, and the fourth partial electrode 232b and the gate of the output transistor 313 are connected via the electrode selector transistor 308.

The output transistor 313 amplifies a voltage signal generated based upon an electric charge from the second partial electrode 231b, read out via the electrode selector transistor 306. In addition, the output transistor 313 amplifies a voltage signal generated based upon an electric charge from the fourth partial electrode 232b read out via the electrode selector transistor 308. A signal having been amplified at the output transistor 313 is read out from a terminal R_Vout via the row selector transistor 315.

The output transistor 314 amplifies a voltage signal generated based upon an electric charge from the first partial electrode 231a, read out via the electrode selector transistor 305. In addition, the output transistor 314 amplifies a voltage signal generated based upon an electric charge from the third partial electrode 232a read out via the electrode selector transistor 307. A signal having been amplified at the output transistor 314 is read out from a terminal L_Vout via the row selector transistor 316. The reset transistors 311 and 312 each allow excess electric charge to be discharged (i.e., so as to reset to a predetermined potential) in response to a reset signal ϕRST.

It is to be noted that since the signal readout circuit for each pixel 220 in the second image sensor 22 is achieved by adopting a structure of the known art, an explanation is not provided.

—Area Through which an Electric Charge is Read Out from a Pixel 210—

In reference to FIG. 8, an example of pairs of photoelectric conversion areas formed in the organic photoelectric conversion film 230 at the pixel 210, in which pairs of light fluxes resulting from pupil splitting are received, in correspondence to the on/off states of the electrode selector transistors 301 through 308, will be explained. FIGS. 8(a) through 8(e) each show photoelectric conversion areas, viewed from the subject side, through which electric charges are read out at the organic photoelectric conversion film 230 in the pixel 210. As explained below, the photoelectric conversion areas through which electric charges generated at the organic photoelectric conversion film 230 can be read out in the first image sensor 21 are part of the area located between the upper partial electrodes 231a and 231 b and the lower partial electrodes 232a and 232b, over which the upper partial electrodes and the lower partial electrodes, being used for purposes of readout, overlap.

(1) Electric Charge Readout Area Pattern in FIG. 8(a)

FIG. 8(a) shows an example in which a first photoelectric conversion area 251 and a second photoelectric conversion area 252 to receive a pair of light fluxes resulting from pupil splitting are formed at the organic photoelectric conversion film 230. The first photoelectric conversion area 251 corresponds to the area of the organic photoelectric conversion film 230 which is covered by the upper partial electrode 231a, whereas the second photoelectric conversion area 252 corresponds to the area of the organic photoelectric conversion film 230 which is covered by the upper partial electrode 231b. In order to read out photoelectric conversion signals from the first and second photoelectric conversion areas 251 and 252, the electrode selector transistors 303, 304, 305 and 306 are turned on with control signals ϕP1, ϕP2, ϕP3 and ϕP4.

As the electrode selector transistors 305 and 306 are turned on in response to the control signals ϕP3 and ϕP4 respectively, the first partial electrode 231a is connected to the gate of the output transistor 314 and the second partial electrode 231b is connected to the gate of the output transistor 313. As the electrode selector transistors 303 and 304 are turned on in response to the control signals ϕP1 and ϕP2 respectively, the third partial electrode 232a and the fourth partial electrode 232b are connected to the ground.

As a result, the electric charge generated in the overlapping area where the first partial electrode 231a overlaps the third and fourth partial electrodes 232a and 232b in the organic photoelectric conversion film 230 is output to the gate of output transistor 314. Namely, the electric charge generated in the first photoelectric conversion area 251 in the organic photoelectric conversion film 230, which corresponds to the first partial electrode 231a, is output to the gate of the output transistor 314, as shown in FIG. 8(a). A photoelectric conversion signal generated based upon the electric charge generated in the first photoelectric conversion area 251 is thus read out from the terminal L_Vout.

Likewise, the electric charge generated in the overlapping area where the second partial electrode 231b overlaps the fourth partial electrodes 232b in the organic photoelectric conversion film 230 is output to the gate of the output transistor 313. In other words, the electric charge generated in the second photoelectric conversion area 252 in the organic photoelectric conversion film 230, which corresponds to the second partial electrode 231b, is output to the gate of the output transistor 313, as shown in FIG. 8(a). As a result, a photoelectric conversion signal generated based upon the electric charge generated in the second photoelectric conversion area 252 is read out from the terminal R_Vout.

This means that the photoelectric conversion signal generated based upon the electric charge generated in the first photoelectric conversion area 251 and the photoelectric conversion signal generated based upon the electric charge generated in the second photoelectric conversion area 252 are read out through the terminal L_Vout and the terminal R_Vout as a pair of photoelectric conversion signals in the electric charge read-out area pattern shown in FIG. 8(a).

In each pixel 210, the organic photoelectric conversion film 230, the first partial electrode 231a, the third partial electrode 232a and the fourth partial electrode 232b together form a first photoelectric conversion unit 261 from which the electric charge generated in the first photoelectric conversion area 251 is read out, whereas the organic photoelectric conversion film 230, the second partial electrode 231b and the fourth partial electrode 232b together form a second photoelectric conversion unit 262 from which the electric charge generated in the second photoelectric conversion area 252 is read out The photoelectric conversion signal generated based upon the electric charge generated in the first photoelectric conversion area 251, which is output through the terminal L_Vout, and the photoelectric conversion signal generated based upon the electric charge generated in the second photoelectric conversion area 252, which is output through the terminal R_Vout, are a pair of photoelectric conversion signals generated based upon a pair of light fluxes having passed through different pupil areas of the photographic optical system 10. These photoelectric conversion signals are used for focus detection executed through the phase method.

(2) Electric Charge Readout Area Pattern in FIG. 8(b)

FIG. 8(b) shows an example in which a third photoelectric conversion area 253 and a fourth photoelectric conversion area 254 to receive a pair of light fluxes resulting from pupil splitting are formed at the organic photoelectric conversion film 230. The third photoelectric conversion area 253 corresponds to the area of the organic photoelectric conversion film 230 which is covered by the lower partial electrode 232a, whereas the fourth photoelectric conversion area 254 corresponds to the area of the organic photoelectric conversion film 230 which is covered by the lower partial electrode 232b. In order to read out photoelectric conversion signals from the third and fourth photoelectric conversion areas 253 and 254, the electrode selector transistors 302, 301, 308 and 307 are turned on with control signals ϕN1, ϕN2, ϕN3 and ϕN4, respectively.

As the electrode selector transistors 307 and 308 are turned on in response to the control signals ϕN4 and ϕN3 respectively, the third partial electrode 232a is connected to the gate of the output transistor 314 and the fourth partial electrode 232b is connected to the gate of the output transistor 313. As the electrode selector transistors 301 and 302 are turned on in response to the control signals ϕN2, ϕN1 respectively, the first partial electrode 231a and the second partial electrode 231b are connected to the ground.

As a result, the electric charge generated in the overlapping area where the third partial electrode 232a overlaps the first partial electrode 231a in the organic photoelectric conversion film 230 is output to the gate of the output transistor 314. Namely, the electric charge generated in the third photoelectric conversion area 253 in the organic photoelectric conversion film 230, which corresponds to the third partial electrode 232a, is output to the gate of the output transistor 314, as shown in FIG. 8(b). A photoelectric conversion signal generated based upon the electric charge generated in the third photoelectric conversion area 253 is thus read out from the terminal L_Vout.

Likewise, the electric charge generated in the overlapping area where the fourth partial electrode 232b overlaps the first and second partial electrodes 231a and 231b in the organic photoelectric conversion film 230 is output to the gate of the output transistor 313. In other words, the electric charge generated in the fourth photoelectric conversion area 254 in the organic photoelectric conversion film 230, which corresponds to the fourth partial electrode 232b, is output to the gate of the output transistor 313, as shown in FIG. 8(b). As a result, a photoelectric conversion signal generated based upon the electric charge generated in the fourth photoelectric conversion area 254 is read out from the terminal R_Vout.

This means that the photoelectric conversion signal generated based upon the electric charge generated in the third photoelectric conversion area 253 and the photoelectric conversion signal generated based upon the electric charge generated in the fourth photoelectric conversion area 254 are read out through the terminal L_Vout and the terminal R_Vout as a pair of photoelectric conversion signals in the electric charge read-out area pattern shown in FIG. 8(b).

In each pixel 210, the organic photoelectric conversion film 230, the first partial electrode 231a and the third partial electrode 232a together form a third photoelectric conversion unit 263 from which the electric charge generated in the third photoelectric conversion area 253 is read out, whereas the organic photoelectric conversion film 230, the first partial electrode 231a, the second partial electrode 231b and the fourth partial electrode 232*b* together form a fourth photoelectric conversion unit 264 from which the electric charge generated in the fourth photoelectric conversion area 254 is read out.

The photoelectric conversion signal generated based upon the electric charge generated in the third photoelectric conversion area 253, which is output through the terminal L_Vout, and the photoelectric conversion signal generated based upon the electric charge generated in the fourth photoelectric conversion area 254, which is output through the terminal R_Vout, are a pair of photoelectric conversion signals generated based upon a pair of light fluxes having passed through different pupil areas of the photographic optical system 10. These photoelectric conversion signals are used for focus detection executed through the phase method.

Figure 8:
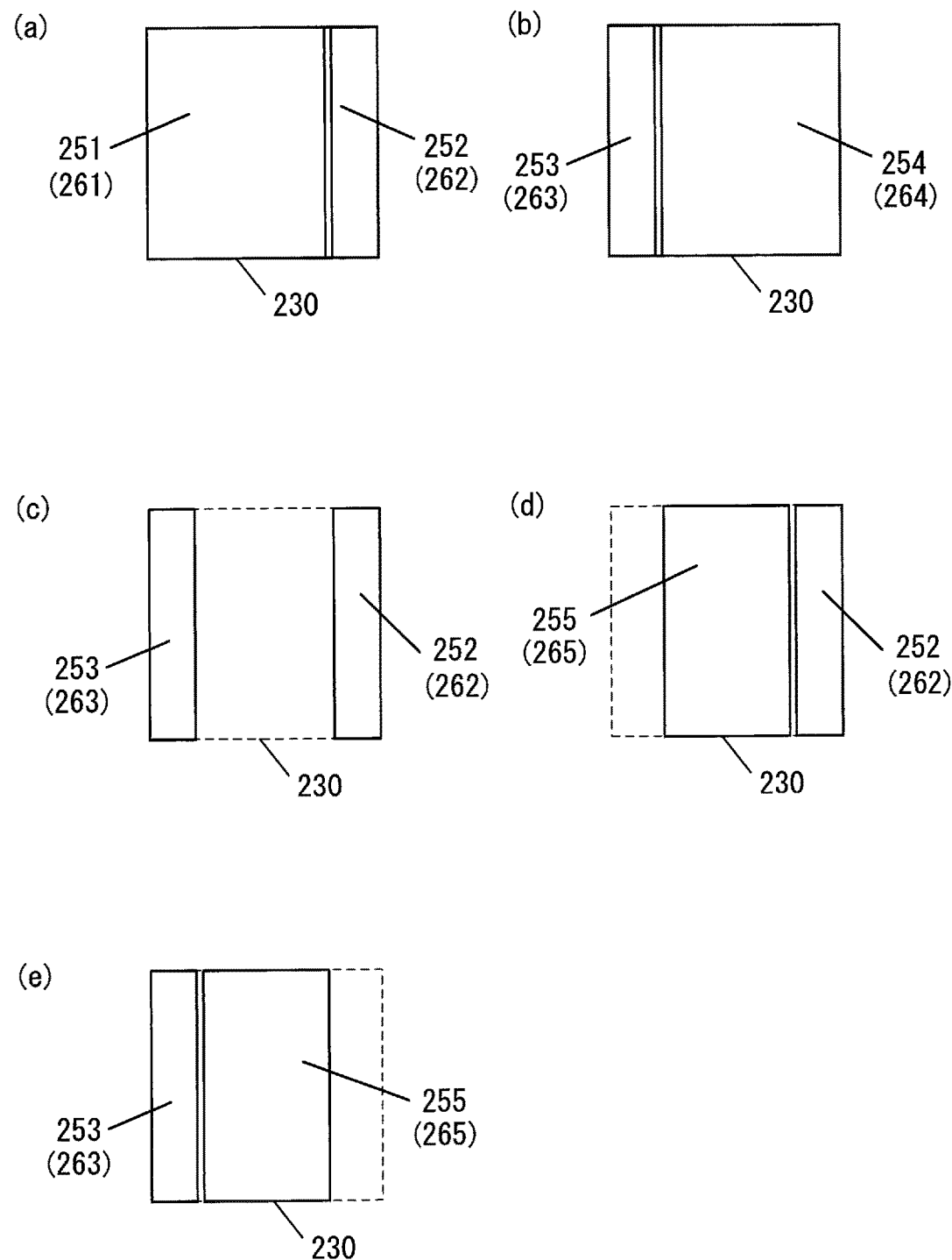
FIG. 8 shows illustrations of photoelectric conversion areas where electric charges are read out at the organic photoelectric conversion film 230 in a pixel 210, viewed from the subject side.

(3) Electric Charge Readout Area Pattern in FIG. 8(*c*)

FIG. 8(*c*) shows an example in which the second photoelectric conversion area 252 and the third photoelectric conversion area 253 to receive a pair of light fluxes resulting from pupil splitting are formed at the organic photoelectric conversion film 230. In order to read out photoelectric conversion signals from the second and third photoelectric conversion areas 252 and 253, the electrode selector transistors 304, 301, 306 and 307 are turned on with control signals φP2, φN2, φP4 and φN4.

As the electrode selector transistors 306 and 304 are turned on in response to the control signals φ4 and φ2 respectively, the second partial electrode 231*b* is connected to the gate of the output transistor 313 and the fourth partial electrode 232*b* is connected to the ground. As the electrode selector transistors 307 and 301 are turned on in response to the control signals φN4, φN2 respectively, the third partial electrode 232*b* is connected to the gate of the output transistor 314 and the first partial electrode 231*a* is connected to the ground.

As a result, the electric charge generated in the overlapping area where the second partial electrode 231*b* overlaps the fourth partial electrode 232*b* in the organic photoelectric conversion film 230 is output to the gate of the output transistor 313. Namely, the electric charge generated in the second photoelectric conversion area 252 in the organic photoelectric conversion film 230, which corresponds to the second partial electrode 231*b*, is output to the gate of the output transistor 313, as shown in FIG. 8(*c*). A photoelectric conversion signal generated based upon the electric charge generated in the second photoelectric conversion area 252, i.e., the photoelectric conversion signal provided from the second photoelectric conversion unit 262, is thus read out from the terminal R_Vout.

Likewise, the electric charge generated in the overlapping area where the third partial electrode 232*a* overlaps the first partial electrode 231*a* in the organic photoelectric conversion film 230 is output to the gate of the output transistor 314. In other words, the electric charge generated in the third photoelectric conversion area 253 in the organic photoelectric conversion film 230, which corresponds to the third partial electrode 232*a*, is output to the gate of the output transistor 314, as shown in FIG. 8(*c*). As a result, a photoelectric conversion signal generated based upon the electric charge generated in the third photoelectric conversion area 253, i.e., the photoelectric conversion signal provided from the third photoelectric conversion unit 263, is read out from the terminal L_Vout.

The photoelectric conversion signal generated based upon the electric charge generated in the third photoelectric conversion area 253, which is output through the terminal L_Vout, and the photoelectric conversion signal generated based upon the electric charge generated in the second photoelectric conversion area 252, which is output through the terminal R_Vout, are a pair of photoelectric conversion signals generated based upon a pair of light fluxes having passed through different pupil areas of the photographic optical system 10. These photoelectric conversion signals are used for focus detection executed through the phase method.

(4) Electric Charge Readout Area Pattern in FIG. 8(*d*)

FIG. 8(*d*) shows an example in which the second photoelectric conversion area 252 and a fifth photoelectric conversion area 255 to receive a pair of light fluxes resulting from pupil splitting are formed at the organic photoelectric conversion film 230. The fifth photoelectric conversion area 255 corresponds to the area of the organic photoelectric conversion film 230 where the upper partial electrode 231*a* and the lower partial electrode 232*b* overlap each other. In order to read out photoelectric conversion signals from the second and fifth photoelectric conversion areas 252 and 255, the electrode selector transistors 304, 305 and 306 are turned on with control signals φP2, φP3 and φ4.

As the electrode selector transistors 305, 306 and 304 are turned on in response to the control signals φP3, φP4 and φP2 respectively, the first partial electrode 231*a* is connected to the gate of the output transistor 314, the second partial electrode 231*b* is connected to the gate of the output transistor 313, and the fourth partial electrode 232*b* is connected to the ground.

As a result, the electric charge generated in the overlapping area where the first partial electrode 231*a* overlaps the fourth partial electrode 232*b* in the organic photoelectric conversion film 230 is output to the gate of the output transistor 314. Namely, the electric charge generated in the fifth photoelectric conversion area 255, which corresponds to the overlapping area where the first partial electrode 231*a* and the fourth partial electrode 232*b* overlap each other at the organic photoelectric conversion film 230, is output to the gate of the output transistor 314, as shown in FIG. 8(*d*). A photoelectric conversion signal generated based upon the electric charge generated in the fifth photoelectric conversion area 255 is thus read out from the terminal L_Vout.

Likewise, the electric charge generated in the overlapping area where the second partial electrode 231*b* overlaps the fourth partial electrode 232*b* in the organic photoelectric conversion film 230 is output to the gate of the output transistor 313. In other words, the electric charge generated in the second photoelectric conversion area 252 in the organic photoelectric conversion film 230, which corresponds to the second partial electrode 231*b*, is output to the gate of the output transistor 313, as shown in FIG. 8(*d*). As a result, a photoelectric conversion signal generated based upon the electric charge generated in the second photoelectric conversion area 252 is read out from the terminal R_Vout.

In each pixel 210, the organic photoelectric conversion film 230, the first partial electrode 231*a* and the fourth partial electrode 232*b* together form a fifth photoelectric conversion unit 265 from which the electric charge generated in the fifth photoelectric conversion area 255 is read out.

The photoelectric conversion signal generated based upon the electric charge generated in the fifth photoelectric conversion area 255, which is output through the terminal L_Vout, and the photoelectric conversion signal generated based upon the electric charge generated in the second photoelectric conversion area 252, which is output through the terminal R_Vout, are a pair of photoelectric conversion signals generated based upon a pair of light fluxes having passed through different pupil areas of the photographic optical system 10. These photoelectric conversion signals are used for focus detection executed through the phase method.

(5) Electric Charge Readout Area Pattern in FIG. 8(*e*)

FIG. 8(*e*) shows an example in which the third photoelectric conversion area 253 and the fifth photoelectric conversion area 255 to receive a pair of light fluxes resulting from pupil splitting are formed at the organic photoelectric conversion film 230. In order to read out the photoelectric conversion signals from the third and fifth photoelectric conversion areas 253 and 255, the electrode selector transistors 301, 308 and 307 are turned on with control signals φN2, φN3 and φN4.

As the electrode selector transistors 307, 308 and 301 are turned on in response to the control signals φN4, φN3 and φN2 respectively, the third partial electrode 232*a* is connected to the gate of the output transistor 314, the fourth partial electrode 232*b* is connected to the gate of the output transistor 313, and the first partial electrode 231*a* is connected to the ground.

As a result, the electric charge generated in the overlapping area where the third partial electrode 232*a* overlaps the first partial electrode 231*a* in the organic photoelectric conversion film 230 is output to the gate of the output transistor 314. Namely, the electric charge generated in the third photoelectric conversion area 253 in the organic photoelectric conversion film 230, which corresponds to the third partial electrode 232*a* is output to the gate of the output transistor 314, as shown in FIG. 8(*e*). A photoelectric conversion signal generated based upon the electric charge generated in the third photoelectric conversion area 253 is thus read out from the terminal L_Vout.

Likewise, the electric charge generated in the overlapping area where the first partial electrode 231*a* overlaps the fourth partial electrode 232*b* in the organic photoelectric conversion film 230 is output to the gate of the output transistor 313. In other words, the electric charge generated in the fifth photoelectric conversion area 255, which corresponds to the overlapping area where the first partial electrode 231*a* and the fourth partial electrode 232*b* overlap each other at the organic photoelectric conversion film 230, is output to the gate of the output transistor 313, as shown in FIG. 8(*c*). As a result, a photoelectric conversion signal generated based upon the electric charge generated in the fifth photoelectric conversion area 255 is read out from the terminal R_Vout.

The photoelectric conversion signal generated based upon the electric charge generated in the third photoelectric conversion area 253, which is output through the terminal L_Vout, and the photoelectric conversion signal generated based upon the electric charge generated in the fifth photoelectric conversion area 255, which is output through the terminal R_Vout, are a pair of photoelectric conversion signals generated based upon a pair of light fluxes having passed through different pupil areas of the photographic optical system 10. These photoelectric conversion signals are used for focus detection executed through the phase method.

The photoelectric conversion signals read out from the individual pixels 210 in the first image sensor 21 as described above are used to detect the focusing condition at the photographic optical system 10 in correspondence to the positional relationship between the focus detection pupil plane and the plane of the exit pupil at the photographic optical system 10, as will be explained later.

It is to be noted that formation patterns of electric charge readout areas, through which the electric charges are read out from the individual pixels 210, are not limited to those described above. For instance, photoelectric conversion signals may be obtained from the second photoelectric conversion areas 252 alone, photoelectric conversion signals may be obtained through the third photoelectric conversion areas 253 alone or photoelectric conversion signals may be obtained through the fifth photoelectric conversion areas 255 alone.

In addition, an electric charge readout area pattern at the individual pixels 210 in the first image sensor 21 and a range of pixels 210 for photoelectric conversion signal readout may be selected in a desired combination. For instance, a uniform electric charge readout area pattern may be set for all the pixels 210 in the first image sensor, or electric charge readout area patterns may differ depending on the position taken at the image-capturing surface, as described below.

As described above, photoelectric conversion signals can be obtained from the first through fifth photoelectric conversion areas 251 through 255 formed with the first and second partial electrodes 231*a* and 231*b* disposed at one surface of the organic photoelectric conversion film 230 and the third and fourth partial electrodes 232*a* and 232*b* disposed at the other surface of the organic photoelectric conversion film 230 in the embodiment. As a result, the electric charge readout areas can be adjusted in an optimal manner by using the upper partial electrodes and the lower partial electrodes in a specific combination for purposes of charge readout, which makes it possible to assure better convenience in the use of the first image sensor 21.

It is to be noted that a photoelectric conversion signal generated based upon the electric charge generated in the second photoelectric conversion area 252 may be read out through the terminal R_Vout, as described below. As the electrode selector transistors 308 and 302 are turned on in response to the control signals φN3 and φN1, the fourth partial electrode 232*b* is connected to the gate of the output transistor 313 and the second partial electrode 231*b* is connected to the ground.

As a result, the electric charge generated in the overlapping area where the second partial electrode 231*b* and the fourth partial electrode 232*b* overlap at the organic photoelectric film 230 is output to the gate of the output transistor 313. In other words, the electric charge generated in the second photoelectric conversion area 252 corresponding to the second partial electrode 231*b* at the organic photoelectric film 230 is output to the gate of the output transistor 313. A photoelectric conversion signal generated based upon the electric charge generated in the second photoelectric conversion area 252 is thus read out through the terminal R_Vout.

In addition, a photoelectric conversion signal generated based upon the electric charge generated in the third photoelectric conversion area 253 may be read out through the terminal L_Vout, as described below. As the electrode selector transistors 305 and 303 are turned on in response to the control signals φP3 and φP1, the first partial electrode 231*a* is connected to the gate of the output transistor 314 and the third partial electrode 232*a* is connected to the ground.

As a result, the electric charge generated in the overlapping area where the third partial electrode 232*a* and the first partial electrode 231*a* overlap at the organic photoelectric film 230 is output to the gate of the output transistor 314. In other words, the electric charge generated in the third photoelectric conversion area 253 corresponding to the third partial electrode 232*a* at the organic photoelectric film 230 is output to the gate of the output transistor 314. A photoelectric conversion signal generated based upon the electric charge generated in the third photoelectric conversion area 253 is thus read out through the terminal L_Vout.

Figure 9:
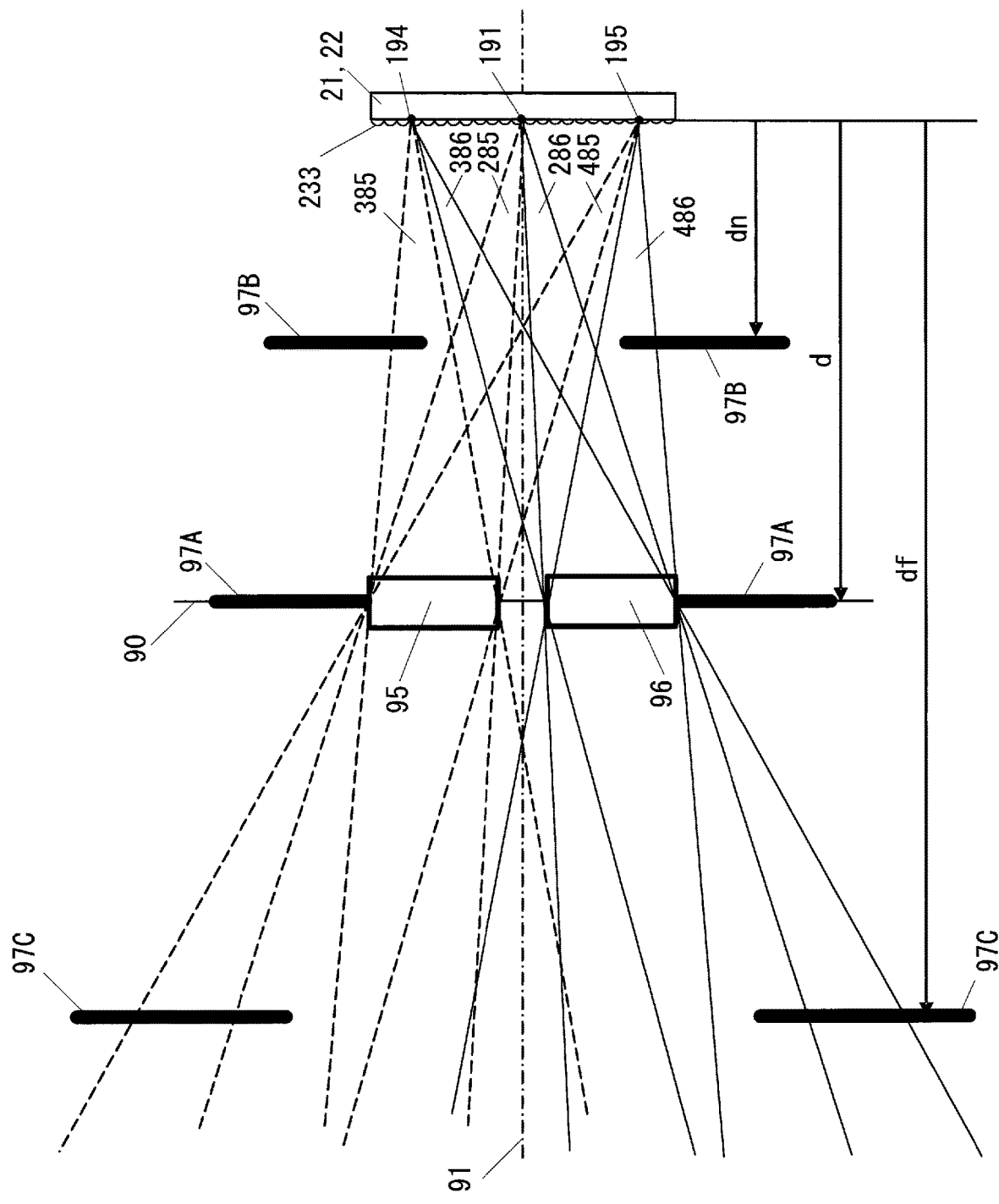
FIG. 9 shows an illustration of vignetting, showing how a pair of light fluxes arriving at pixels disposed on the first and second image sensors are restricted by the exit pupil of the photographic optical system in correspondence to the positional relationship between the exit pupil plane and the focus detection pupil plane.

FIG. 9 provides an illustration of vignetting, indicating how a pair of light fluxes arriving at pixels 210 and 220 disposed on the first and second image sensors 21 and 22 are restricted by the exit pupil of the photographic optical system 10 in correspondence to the positional relationship between the exit pupil plane and the focus detection pupil plane.

The term "exit pupil" is used to refer to an image of the aperture opening at the photographic optical system 10, viewed from the image sensor side, and the exit pupil distance is defined in the description of the embodiment as the distance measured from a microlens 233 to an exit pupil 97 (97A through 97C) of the photographic optical system 10. A focus detection pupil plane 90 is a plane conjugate to the organic photoelectric conversion film 230 in a pixel 210 at the image sensor 21 relative to the corresponding microlens 233 or a plane conjugate to the first and second photoelectric conversion units 220a and 220b in a pixel 220 at the second image sensor 22 relative to the corresponding microlens 233. It is to be noted that the plane conjugate to the organic photoelectric conversion film 230 in the first image sensor 21 relative to the microlens 233 and the plane conjugate to the first and second photoelectric conversion units 220a and 220b in the pixel 220 at the second image sensor 22 relative to the microlens 233 are not in exact alignment and they are slightly offset relative to each other along the optical axis of the photographic optical system. However, the focus detection pupil plane pertaining to the first image sensor 21 and the focus detection pupil plane pertaining to the second image sensor 22 are both set at a single position 90 in the illustration presented in FIG. 9. A focus detection pupil distance d is the distance between the microlens 233 and the focus detection pupil plane 90.

A pair of focus detection pupils 95 and 96 on the focus detection pupil plane 90 are split pupils used for focus detection executed by adopting a method known as the split pupil method. A pair of light fluxes having passed through the focus detection pupils 95 and 96 enter a pair of photoelectric conversion areas (e.g., the first and second photoelectric conversion areas 251 and 252 in FIG. 8) in each pixel 210 at the first image sensor 21 and then enter a pair of photoelectric conversion units in each pixel 220 at the second image sensor 22.

Figure 10:
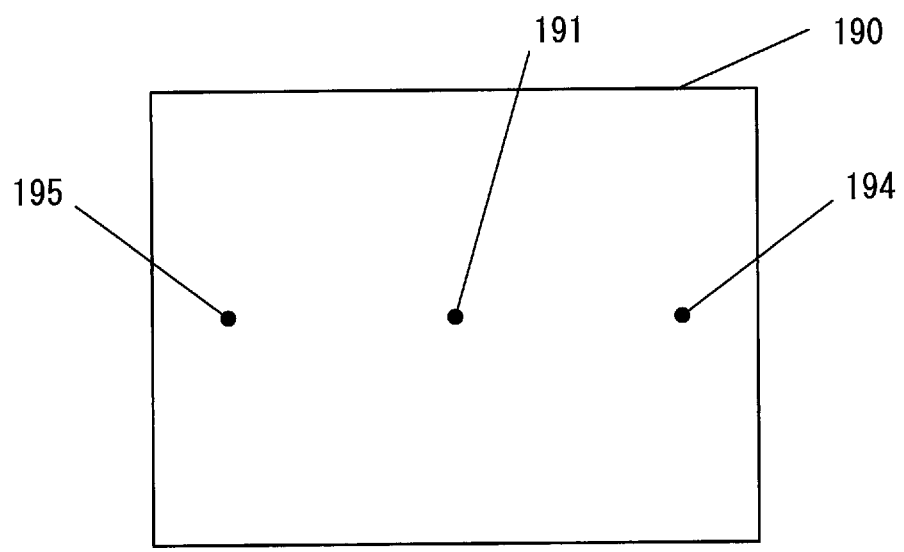
FIG. 10 is a front view of the image-capturing surface of the first or second image sensor.

A center 191 and positions 194 and 195 set apart from the center in the first and second image sensors 21 and 22 in FIG. 9 respectively correspond to a center 191 and positions 194 and 195 in FIG. 10. FIG. 10 is a front view of an image-capturing surface 190 in each of the first and second image sensors 21 and 22. The center 191 of the image-capturing surface 190 in FIG. 10 is in alignment with an optical axis 91 of the photographic optical system 10. Positions set apart from the center 191 by a predetermined distance along the row direction are designated as peripheral positions 194 and 195. The peripheral positions 194 and 195 are symmetrical to each other relative to the center 191. As FIG. 9 shows, pairs of light fluxes (285, 286), (385, 386) and (485, 486), each having passed through the pair of detection pupils 95 and 96, respectively reach the pixels 210 and 220 disposed at the center 191, the pixels 210 and 220 disposed at the peripheral position 194, and the pixels 210 and 220 disposed at the peripheral position 195.

When the exit pupil 97A of the photographic optical system 10 is in alignment with the focus detection pupil plane 90, i.e., when the exit pupil distance matches the focus detection pupil distance d, the pair of focus detection pupils 95 and 96 are contained within the exit pupil 97A with a circular shape centered on the optical axis 91. As a result, the pairs of light fluxes (285, 286), (385, 386) and (485, 486) arriving at the individual pixels 220 on the second image sensor 22 are each restricted symmetrically relative to the optical axis. In this case, the amounts of light received at the first and second photoelectric conversion units 220a and 220b in each pixel 220 are equal to each other.

When the exit pupil 97B of the photographic optical system 10 takes a position between the focus detection pupil plane 90 and the microlenses 233, i.e., when the exit pupil distance dn is smaller than the focus detection pupil distance d, the pair of light fluxes (285, 286) arriving at the pixel 220 disposed at the center 191 is restricted symmetrically relative to the optical axis, and thus, the first and second photoelectric conversion units 220a and 220b in the pixel 220 receive light in amounts equal to each other. However, asymmetrical vignetting occurs in the pair of light fluxes (385, 386) or (485, 486) arriving at the pixel 220 disposed at the peripheral positions 194 or 195, and as a result, the amounts of light received at the first and second photoelectric conversion units 220a and 220b in the pixel 220 at the peripheral position 194 or 195 are different from each other.

When the exit pupil 97C of the photographic optical system 10 takes a position further toward the subject relative to the detection pixel plane 90, i.e., when the exit pupil distance df is greater than the focus detection pupil distance d, the pair of light fluxes (285, 286) arriving at the pixel 220 disposed at the center 191 is restricted symmetrically relative to the optical axis, and thus, the first and second photoelectric conversion units 220a and 220b in the pixel 220 receive light in amounts equal to each other. However, asymmetrical vignetting occurs in the pair of light fluxes (385, 386) or (485, 486) arriving at the pixel 220 disposed at the peripheral position 194 or 195, and as a result, the amounts of light received at the first and second photoelectric conversion units 220a and 220b in the pixel 220 at the peripheral position 194 or 195 are different from each other.

It is to be noted that vignetting occurs in one of a pair of light fluxes entering the pixels disposed at the peripheral positions 194 and 195 when the photographic optical system 10 has the exit pupil 97B, whereas vignetting occurs the other of the pair of light fluxes entering the pixel disposed at the peripheral position 194 or 195 when the photographic optical system 10 has the exit pupil 97C.

As explained above, when the exit pupil plane of the photographic optical system 10 is not in alignment with the focus detection pupil plane and the pixel receiving a pair of light fluxes is not disposed at the center 191 of the second image sensor 22, i.e., a pair of light fluxes enters a pixel disposed at a peripheral position 194 or 195, the pair of light fluxes is restricted asymmetrically by the exit pupil 97B or 97C of the photographic optical system 10. The extent to which the light fluxes are restricted asymmetrically changes in correspondence to the difference between the exit pupil distance at the photographic optical system 10 and the focus detection pupil distance d and the distance between the peripheral position 194 or 195 and the center 191.

Figure 11:
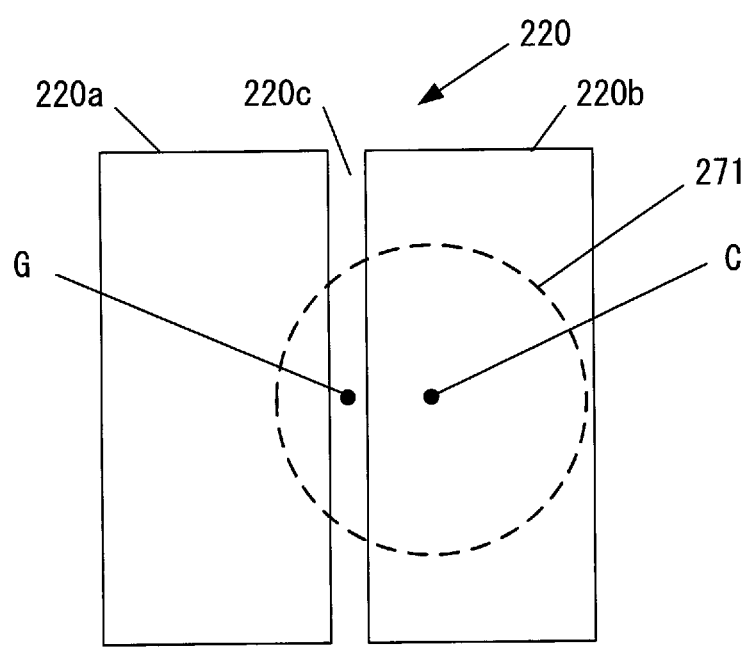
FIG. 11 is a front view indicating the range over which light enters the first and second photoelectric conversion units in a pixel disposed at a peripheral position.

FIG. 11 is a front view of the pixel 220 disposed at the peripheral position 194 in FIGS. 9 and 10, indicating the range over which the light fluxes enter the first and second photoelectric conversion units 220a and 220b at the pixel 220 when the exit pupil distance dn at the photographic optical system 10 is smaller than the focus detection pupil distance d. On the first and second photoelectric conversion units 220a and 220b at the pixel 220, a circular image 271 of the exit pupil of the photographic optical system 10 is formed via the microlens 233. The asymmetrical restriction of the pair of light fluxes described above corresponds to an offset of a central position C of the circular image 271 of the exit pupil relative to a central position G of an element separation area 220c equivalent to the position of the geographical center of the first and second photoelectric conversion units 220a and 220b. When the exit pupil distance dn in the photographic optical system 10 is smaller than the focus detection pupil distance d, the central position C of the image of the exit pupil moves further toward the greater image height side, i.e., toward the peripheral edge of the second image sensor 22, as the image height increases.

When the exit pupil distance df is greater than the focus detection pupil distance d, the positional relationship between the first and second photoelectric conversion units 220a and 220b and the circular shape 271 in the pixel disposed at the peripheral position 194 is reversed from that shown in FIG. 11. Specifically, the central position C of the circular shape 271 is offset further to the left in the figure relative to the central position G of the element separation area 220c. Namely, when the exit pupil distance df in the photographic optical system 10 is greater than the focus detection pupil distance d, the central position C of the image of the exit pupil moves further toward the center 191 of the second image sensor 22, as the image height increases.

When the exit pupil distance dn is smaller than the focus detection pupil distance d, the positional relationship of the first and second photoelectric conversion units 220a and 220b to the circular shape 271 in the pixel disposed at the position 195 symmetry to the position 194 relative to the center 191 along the horizontal direction as shown in FIG. 11 is reversed from the positional relationship shown in FIG. 11. Namely, the central position C of the circular shape 271 is offset further to the left side in the figure relative to the central position G of the element separation area 220c.

When the exit pupil distance df is greater than the focus detection pupil distance d, the positional relationship of the first and second photoelectric conversion units 220a and 220b to the circular shape 271 in the pixel disposed at the position 195 symmetry to the position 194 along the horizontal direction relative to the center 191, is identical to the positional relationship shown in FIG. 11.

As described above, the central position C of the exit pupil image formed at a pixel 220 is offset relative to the central position G of the element separation area 220c in correspondence to the positional relationship between the exit pupil plane and the focus detection pupil plane, by a greater extent with increase in the image height. Accordingly, the range of pixels 210 and 220, from which photoelectric conversion signals are to be read out for purposes of detecting the focusing condition at the photographic optical system 10, is adjusted as described below in correspondence to the positional relationship between the exit pupil plane and the focus detection pupil plane in the embodiment.

The photographic optical system 10 may be an interchangeable lens that is detachably mounted at a camera body and, in such a case, the position of the exit pupil changes in correspondence to the interchangeable lens that is currently mounted. The position of the exit pupil may also change in correspondence to the zoom position when the photographic optical system 10 includes a zoom lens. In the embodiment, either the pair of photoelectric conversion areas 251 and 252 or the pair of photoelectric conversion areas 253 and 254, for instance, is selected at the first image sensor 21 in correspondence to the exit pupil distance at the photographic optical system 10, so as to use the optimal pair of photoelectric conversion areas best suited for the particular exit pupil position taken at the photographic optical system. The concept will be described in detail below.

Figure 12:
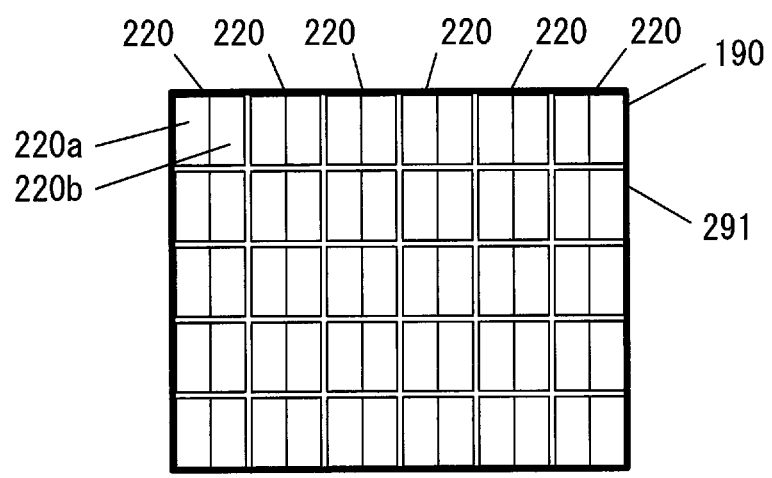
FIG. 12 is an illustration of a condition assumed when the exit pupil distance d at the photographic optical system matches the focus detection pupil distance d.

(a) When the Exit Pupil Distance d at the Photographic Optical System 10 Matches the Focus Detection Pupil Distance d FIG. 12 shows pixels at an image sensor used for purposes of focus detection when the exit pupil distance d matches the focus detection pupil distance d. It is to be noted that in FIG. 12 and FIGS. 13 through 15, in reference to which a description will be provided later, pixels 210 and 220 disposed over a range of 5 rows×6 columns are shown to represent the respective image-capturing surfaces in their entirety for purposes of illustration simplification. When the exit pupil distance d in the photographic optical system 10 matches the focus detection pupil distance d, the pairs of light fluxes (285, 286), (385, 386) and (485, 486) arriving at the various pixels are each restricted symmetrically relative to the optical axis as explained with reference to FIG. 9. As a result, the central position C of the exit pupil image is aligned with the central position G of the element separation area 220c equivalent to the position of the geographical center of the first and second photoelectric conversion units 220a and 220b. For this reason, the amount of light received at the first photoelectric conversion unit 220a and the amount of light received at the second photoelectric conversion unit 220b in each pixel 220 at the second image sensor are substantially equal to each other, even when the image height increases.

Accordingly, the photoelectric conversion signals provided from the first and second photoelectric conversion units 220a and 220b in each pixel 220 at the second image sensor 22 are used as focus detection signals, as shown in FIG. 12. This means that when the exit pupil distance d in the photographic optical system is equal to the focus detection pupil distance d, the focus detection unit 12b shown in FIG. 1 executes focus detection by using the photoelectric conversion signals provided from the pixels 220 disposed over the entire image-capturing surface 190 in FIG. 10 at the second image sensor 22, without using photoelectric conversion signals from the pixels disposed at the first image sensor 21. It is to be noted that even when there is a difference between the exit pupil distance d in the photographic optical system 10 and the focus detection pupil distance d, the exit pupil distance d in the photographic optical system 10 and the focus detection pupil distance d are regarded to be the same as long as the difference is within a predetermined range.

(b) When the Exit Pupil Distance Dn in the Photographic Optical System 10 is Smaller than the Focus Detection Pupil Distance d FIG. 13 illustrates a condition where the exit pupil distance dn in the photographic optical system 10 is smaller than the focus detection pupil distance d. As shown in FIG. 13(a), the image-capturing surface 190 is divided into three sections, i.e., a central portion 190A, a left peripheral portion 190B and a right peripheral portion 190C. In the left and right peripheral portions 190B and 190C, photoelectric conversion signals from the first through fourth photoelectric conversion areas in pixels in the first image sensor 21 are used as focus detection signals and photoelectric conversion signals from the first and second photoelectric conversion units in pixels in the second image sensor 22 are used as focus detection signals in the central portion 190A of the image-capturing area 190, as shown in FIG. 13(b). In other words, focus detection is executed by using the photoelectric conversion signals provided from the first through fourth photoelectric conversion areas of pixels in the first image sensor 21, as focus detection signals corresponding to the peripheral areas in the photographic image plane achieved via the photographic optical system 10, whereas focus detection is executed by using the photoelectric conversion signals from the first and second photoelectric conversion units in pixels in the second image sensor 22 as focus detection signals corresponding to the central area of the photographic image plane.

FIG. 13(*b*) shows the various photoelectric conversion areas 251, 252, 253 and 254 formed in the individual pixels 210 in the first image sensor. The electrode selector transistors 303, 304, 305 and 306 in the readout circuit shown in FIG. 7 are turned on so as to form the first and second photoelectric conversion areas 251 and 252, as shown in FIG. 8(*a*), in each pixel 210 present in the right peripheral portion 190C of the image-capturing surface 190 at the first image sensor 21. In addition, the electrode selector transistors 302, 301, 308 and 307 in the readout circuit shown in FIG. 7 are turned on so as to form the third and fourth photoelectric conversion areas 253 and 254, as shown in FIG. 8(*b*) in each pixel 210 present in the left peripheral portion 190B of the image-capturing surface 190 at the first image sensor 21.

The focus detection unit 12*a* executes focus detection for the left peripheral portion 190B of the image-capturing surface 190 by using the photoelectric conversion signals provided from the third and fourth photoelectric conversion areas 253 and 254 in the pixels 210 present in the left peripheral portion of the first image sensor 21 as focus detection signals, executes focus detection for the right peripheral portion 190C of the image-capturing surface 190 by using the photoelectric conversion signals provided from the first and second photoelectric conversion areas 251 and 252 in the pixels 210 present in the right peripheral portion of the first image sensor 21 as focus detection signals, and executes focus detection for the central portion 190A of the image-capturing surface 190 by using the photoelectric conversion signals provided from the first and second photoelectric conversion units 220*a* and 220*b* in the pixels 220 present in the central portion at the second image sensor 22 as focus detection signals, as shown in FIG. 13(*c*). As a result, an improvement is achieved in the detection accuracy with which the focusing condition of the photographic optical system 10 in the peripheral areas of the image-capturing surface 190 in the row direction is detected. This means that the range over which focus detection can be executed in a desirable manner through the phase detection method can be expanded toward the peripheral edges of the image-capturing surface 190.

(c) When the Exit Pupil Distance Df in the Photographic Optical System 10 is Greater than the Focus Detection Pupil Distance d FIG. 14 illustrates a condition where the exit pupil distance df in the photographic optical system 10 is greater than the focus detection pupil distance d. When the exit pupil distance df in the photographic optical system 10 is greater than the focus detection pupil distance d, the photoelectric conversion signals from the first through fourth photoelectric conversion areas of pixels in the first image sensor 21 are used as focus detection signals in the left and right peripheral portions 190B and 190C of the image-capturing surface 190 and the photoelectric conversion signals from the first and second photoelectric conversion units in pixels in the second image sensor 22 are used as focus detection signals in the central portion 190A of the image-capturing surface 190, as shown in FIG. 14(*a*). The concept will be described in detail below.

FIG. 14(*a*) shows the various photoelectric conversion areas 251, 252, 253 and 254 formed in the individual pixels 210 in the first image sensor. The electrode selector transistors 302, 301, 308 and 307 in the readout circuit shown in FIG. 7 are turned on so as to form the third and fourth photoelectric conversion areas 253 and 254, as shown in FIG. 8(*b*), in each pixel 210 present in the right peripheral portion 190C of the image-capturing surface 190 at the first image sensor 21. In addition, the electrode selector transistors 303, 304, 305 and 306 in the readout circuit shown in FIG. 7 are turned on so as to form the first and second photoelectric conversion areas 251 and 252, as shown in FIG. 8(*a*), in each pixel 210 present in the left peripheral portion 190B of the image-capturing surface 190 at the first image sensor 21.

The focus detection unit 12*a* executes focus detection for the left peripheral portion 190B of the image-capturing surface 190 by using the photoelectric conversion signals provided from the first and second photoelectric conversion areas 251 and 252 in the pixels 210 present in the left peripheral portion of the first image sensor 21 as focus detection signals, executes focus detection for the right peripheral portion 190C of the image-capturing surface 190 by using the photoelectric conversion signals provided from the third and fourth photoelectric conversion areas 253 and 254 in the pixels 210 present in the right peripheral portion of the first image sensor 21 as focus detection signals, and executes focus detection for the central portion 190A of the image-capturing surface 190 by using the photoelectric conversion signals provided from the first and second photoelectric conversion units 220*a* and 220*b* in the pixels 220 present in the central portion at the second image sensor 22 as focus detection signals. As a result, an improvement is achieved in the detection accuracy with which the focusing condition of the photographic optical system 10 in the peripheral areas of the image-capturing surface 190 in the row direction, is detected. This means that the range over which focus detection can be executed in a desirable manner through the phase detection method can be expanded toward the peripheral edges of the image-capturing surface 190.

It is to be noted that the positions at which the image-capturing surface 190 is split into the central portion 190A, the left peripheral portion 190B and the left peripheral portion 190C as described above may be adjusted in correspondence to the difference between the exit pupil distance dn or df in the photographic optical system 10 and the focus detection pupil distance d. Namely, as the difference between the exit pupil distance dn or df in the photographic optical system 10 and the focus detection pupil distance d increases, the left peripheral portion 190B and the right peripheral portion 190C may be set to have a greater width measured along the left/right direction in the figures, so as to expand the range over which the photoelectric conversion signals from the first through fourth photoelectric conversion areas in the pixels at the first image sensor 21 are used as focus detection signals.

—In a State of Pronounced Defocus—

Figure 15:
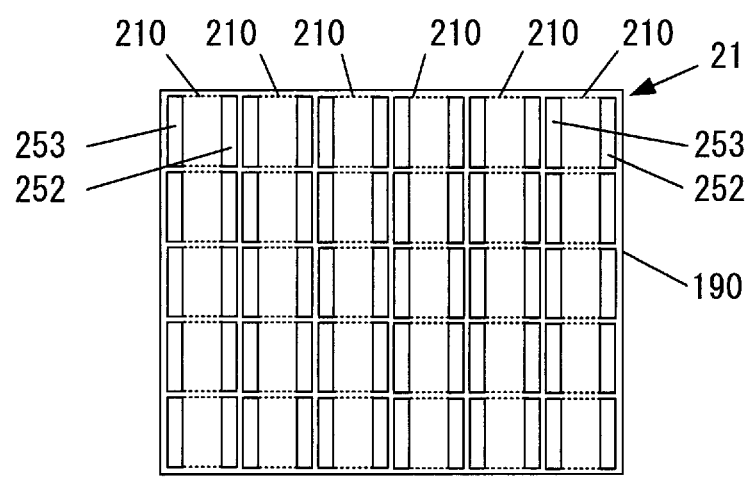
FIG. 15 is an illustration of a state of pronounced defocus.

FIG. 15 illustrates a state of pronounced defocus. In a state of pronounced defocus, the focusing condition at the photographic optical system 10 is detected based upon the photoelectric conversion signals provided from the second and third photoelectric conversion areas 252 and 253 in the pixels 210 at the first image sensor 21, as explained below.

In a state of pronounced defocus, the image is blurred to a greater extent, which makes it difficult to detect the focusing condition at the photographic optical system 10. In addition, when the F-number set at the photographic optical system 10 is small, a greater extent of image blurring occurs in a defocused state due to a small depth of field, which also makes it difficult to detect the focusing condition at the photographic optical system 10.

If the width of a photoelectric conversion area, measured along the direction running parallel to the direction in which the pupil is split, i.e., the width measured along the row direction, is reduced, the light flux to enter the photoelectric conversion area is restricted, resulting in a smaller extent of image blurring. As a result, the focusing condition at the photographic optical system 10 can be detected with better ease even if the F-number at the photographic optical system 10 is small or in a state of pronounced defocus.

Accordingly, the focusing condition at the photographic optical system 10 is detected in the embodiment based upon the photoelectric conversion signals provided from the second and third photoelectric conversion areas 252 and 253 having a smaller width measured along the row direction, i.e. the direction running parallel to the direction in which the pupil is split, in a state of pronounced defocus. For instance, if the focusing condition at the photographic optical system 10 cannot be detected based upon the photoelectric conversion signals based upon the electric charges generated in the first through fourth photoelectric conversion areas 251 through 254 in the pixels 210 at the first image sensor 21 or the photoelectric conversion signals output from the individual pixels 220 at the second image sensor 22, as in (a) through (c) explained earlier, the focusing condition at the photographic optical system 10 is detected based upon the photoelectric conversion signals provided from the second and third photoelectric conversion areas 252 and 253.

Namely, if the focusing condition at the photographic optical system 10 cannot be detected through any of the methods (a) through (c) described above, the focus detection unit 12*a* shown in FIG. 1 switches the on/off states of the electrode selector transistors in the readout circuits in FIG. 7 in all the pixels 210 at the first image sensor 21 so as to output photoelectric conversion signals from the second and third photoelectric conversion areas 252 and 253. The focus detection unit 12*b* then executes focus detection by using the photoelectric conversion signals provided from the second and third photoelectric conversion areas 252 and 253 in all the pixels 210 at the first image sensor 21 over the entire image-capturing surface 190 shown in FIG. 10. Through these measures, the focusing condition at the photographic optical system 10 can be detected with better accuracy even in a state of pronounced defocus or when the F-number at the photographic optical system 10 is small.

As focus detection is executed by using the photoelectric conversion signals provided from the second and third photoelectric conversion areas 252 and 253 in each pixel 210 at the first image sensor 21 as focus detection signals and the focusing lens is driven along the optical axis via a lens drive unit (not shown), the defocus quantity is reduced. It is desirable that once the focusing lens has been driven along the optical axis and the extent of defocus has been reduced, the focus detection unit 12*a* switch the on/off states of the electrode selector transistors in the readout circuits in FIG. 7 so as to re-attempt to detect the focusing condition at the photographic optical system 10 through one of the methods (a) through (c) explained earlier.

It is to be noted that when executing focus detection by using a pair of photoelectric conversion signals provided from the second and third photoelectric conversion areas 252 and 253 in each pixel as focus detection signals, the sensitivity is bound to become lower since the second and third photoelectric conversion areas 252 and 253 take up smaller areas. In such a case, focus detection may also be executed by using the photoelectric conversion signals provided from the first and second photoelectric conversion units 220*a* and 220*b* in each pixel 220 at the second image sensor 22 as focus detection signals.

—Variations of the Positional Arrangement for the Partial Electrodes—

Figure 16:
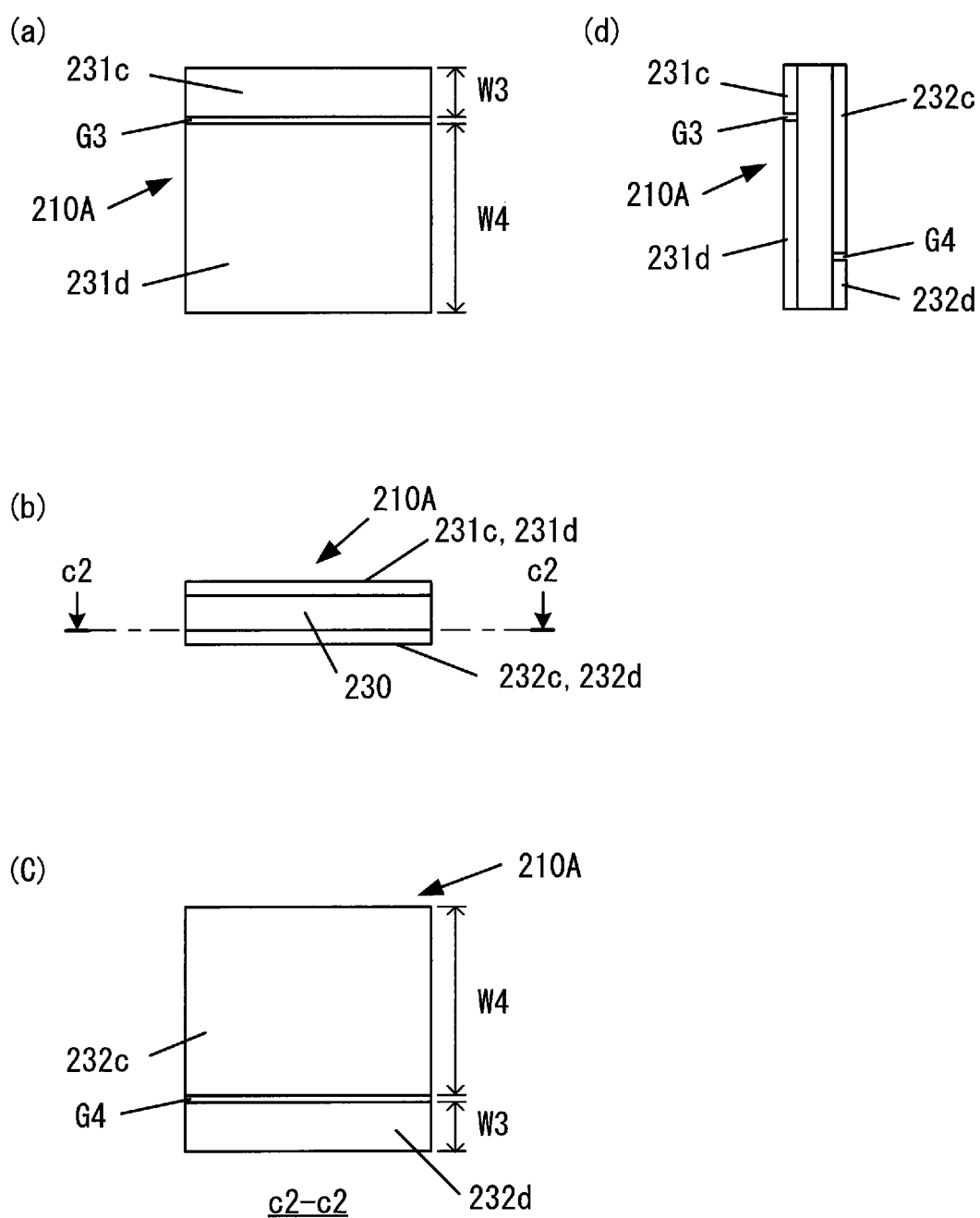
FIG. 16 shows illustrations of a variation.

In the embodiment described above, the pixels 210 in the first image sensor 21 each include first and second partial electrodes 231*a* and 231*b* disposed side-by-side along the row direction and third and fourth partial electrodes 232*a* and 232*b* disposed side-by-side along the row direction, as shown in FIGS. 4 and 5. However, the various partial electrodes may be disposed along a direction other than the direction described above. For instance, the partial electrodes may be disposed along the column direction, as illustrated in FIGS. 16(*a*) through 16(*d*). FIG. 16 schematically illustrates the structure adopted in a pixel 210 in the first image sensor 21 in a variation, with FIG. 16(*a*) showing a pixel 210A in a plan view taken from the subject side, FIG. 16(*b*) showing the pixel 210A in a side elevation taken from a side surface along the column direction, FIG. 16(*c*) showing the pixel 210A in a sectional view taken through c2-c2 in FIG. 16(*b*) and FIG. 16(*d*) showing the pixel 210A in a side elevation taken from a side surface along the row direction.

First and second partial electrodes 231*c* and 231*d* in the pixel 210A in this variation are set side-by-side along the column direction, i.e., along the up/down direction in FIG. 16(*a*). Likewise, third and fourth partial electrodes 232*c* and 232*d* are set side-by-side along the column direction, i.e., along the up/down direction in FIG. 16(*c*). The length of the first partial electrode 231*c*, measured along the column direction and the length of the second partial electrode 231*d* measured along the column direction are different from each other. The length W3 of the first partial electrode 231*c* located on the upper side in FIG. 16(*a*) and FIG. 16(*d*) measured along the column direction, is smaller than the length W4 of the second partial electrode 231*d* located on the lower side in the figures, measured along the column direction. Likewise, the length of the third partial electrode 232*c*, measured along the column direction and the length of the fourth partial electrode 232*d* measured along the column direction are different from each other. The length W4 of the third partial electrode 232*c* located on the upper side in the figures, measured along the column direction, is greater than the length W3 of the fourth partial electrode 232*d* located on the lower side in the figures, measured along the column direction. In other words, viewed from the side on which light enters, the position of a separation area G3 separating the first partial electrode 231*c* from the second partial electrode 231*d*, i.e., the position of the boundary, is different from the position of a separation area G4, i.e., the position of the boundary separating the third partial electrode 232*c* from the fourth partial electrode 232*d*. It is to be noted that the length W3 of the first partial electrode 231*c* measured along the column direction matches the length W3 of the fourth partial electrode 232*d* measured along the column direction, and the length W4 of the second partial electrode 231*d* measured along the column direction matches the length W4 of the third partial electrode 232*c* measured along the column direction.

Thus, the entire first partial electrode 231*c* overlaps, along the optical axis, the third partial electrode 232*c*. The second partial electrode 231*d* overlaps, along the optical axis, part of the third partial electrode 232*c* located toward the lower side in the figures, and the entire fourth partial electrode 232*d*. The third partial electrode 232*c* overlaps, along the optical axis, the entire first partial electrode 231*c* and part of the second partial electrode 231*d* located toward the upper side in the figures. The entire fourth partial electrode 232*d* overlaps, along the optical axis, the third partial electrode 231*d*. In the following description, the first and second partial electrodes 231*c* and 231*d* formed at the upper surface of the organic photoelectric conversion film 230 may be alternatively referred to as upper partial electrodes 231*c* and 231*d* and the third and fourth partial electrodes 232*c* and 232*d* formed at the lower surface of the organic photoelectric conversion film 230 may be alternatively referred to as lower partial electrodes 232*c* and 232*d*.

FIG. 17(*a*) schematically illustrates the positions of the first and second partial electrodes 231*c* and 231*d* at the individual pixels 210A in the first image sensor 21 viewed from the subject side, whereas FIG. 17(*b*) schematically illustrates the positions of the third and fourth partial electrodes 232*c* and 232*d* at the individual pixels 210A at the first image sensor 21 viewed from the subject side. FIG. 17(*c*) schematically illustrates the positions of first and second photoelectric conversion units 220*a* and 220*b* at the individual pixels 220 in the second image sensor 22 viewed from the subject side. It is to be noted that FIG. 17 only shows pixels 210A and 220 disposed in the first and second image sensors 21 and 22 respectively over a range of 5 rows×6 columns, in order to simplify the illustrations.

As explained earlier, the pixels 210A in the first image sensor 21 in FIGS. 17(*a*) and 17(*b*) each include the first and second partial electrodes 231*c* and 231*d* disposed side-by-side along the column direction, i.e., along the up/down direction in FIGS. 17(*a*) and 17(*b*), and the third and fourth partial electrodes 232*c* and 232*d*, also disposed side-by-side along the column direction. The pixels 220 in the second image sensor 22 shown in FIG. 17(*c*) are identical to the pixels 220 in the embodiment described earlier.

Figure 18:
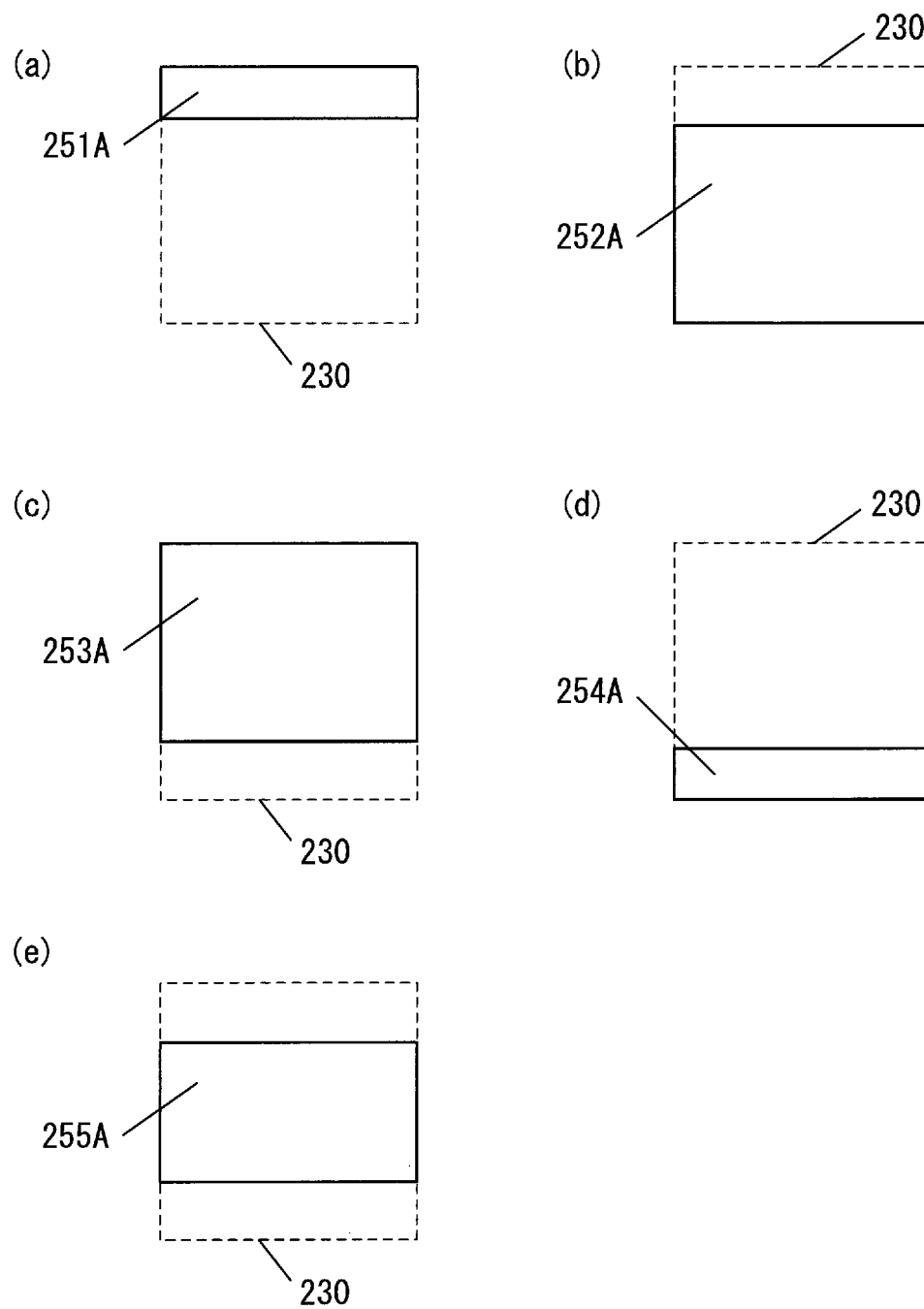
FIG. 18 shows illustrations of a variation.

FIGS. 18(*a*) through 18(*e*) illustrate first through fifth photoelectric conversion areas 251A through 255A, which are formed in the organic photoelectric conversion film 230 in each pixel 210A, viewed from the subject side. As FIGS. 18(*a*) through 18(*e*) show, the first through fifth photoelectric conversion areas 251A through 255A are formed in the pixel 210A. FIG. 18(*a*) shows the first photoelectric conversion area 251A. The first photoelectric conversion area 251A corresponds to the area of the organic photoelectric conversion film 230, which is covered by the upper partial electrode 231*c*. FIG. 18(*b*) shows the second photoelectric conversion area 252A. The second photoelectric conversion area 252A corresponds to the area of the organic photoelectric conversion film 230 which is covered by the upper partial electrode 231*d*. FIG. 18(*c*) shows the third photoelectric conversion area 253A. The third photoelectric conversion area 253A corresponds to the area of the organic photoelectric conversion film 230 which is covered by the lower partial electrode 232*c*. FIG. 18(*d*) shows the fourth photoelectric conversion area 254A. The fourth photoelectric conversion area 254A corresponds to the area of the organic photoelectric conversion film 230 which is covered by the lower partial electrode 232*d*. FIG. 18(*e*) shows the fifth photoelectric conversion area 255A. The fifth photoelectric conversion area 255A corresponds to the area of the organic photoelectric conversion film 230 where the upper partial electrode 231*d* and the lower partial electrode 232*c* overlap.

It is to be noted that the pixels 210 described earlier and the pixels 210A may be disposed at alternate positions along the column direction in the first image sensor 21, as shown in FIGS. 19(*a*) and 19(*b*). FIG. 19(*a*) schematically illustrates the positions of the first and second partial electrodes 231*a*, 231*b*, 231*c* and 231*d* in the individual pixels 210 and 210A in the first image sensor 21, viewed from the subject side. FIG. 19(*b*) schematically illustrates the positions of the third and fourth partial electrodes 232*a*, 232*b*, 232*c* and 232*d* in the individual pixels 210 and 210A in the first image sensor 21, viewed from the subject side. FIG. 19(*c*) schematically illustrates the positions of the first and second photoelectric conversion units 220*a* and 220*b* in the pixels 220 at the second image sensor 22, viewed from the subject side. It is to be noted that FIG. 19 only shows pixels 210 and 210A disposed in the first image sensor 21 and pixels 220 disposed in the second image sensor 22 over a range of 5 rows×6 columns in order to simplify the illustrations. The pixels 220 in the second image sensor 22 shown in FIG. 19(*c*) are identical to the pixels 220 in the embodiment described earlier.

FIGS. 20(*a*) and 20(*b*) show shapes of various partial electrodes, viewed from the subject side, in schematic illustrations of a pixel 210 in the first image sensor 21 achieved in another variation. As in the pixel 210B in this variation, first and second partial electrodes 231*e* and 231*f* in the first image sensor 21 may be formed in shapes achieved by dividing a large rectangle asymmetrically into two portions along a direction running parallel to a diagonal of the rectangle, as shown in FIG. 20(*a*), and third and fourth partial electrodes 232*e* and 232*f* in the first image sensor 21 may be formed in shapes achieved by dividing a large rectangle asymmetrically into two portions along a direction running parallel to a diagonal of the rectangle, as shown in FIG. 20(*b*). The position of the boundary between the first and second partial electrodes 231*e* and 231 *f*, i.e., the position at which they are separated from each other, and the position of the boundary between the third and fourth partial electrodes 232*e* and 232*f*, i.e., the position at which they are separated from each other, do not match.

Figure 21:
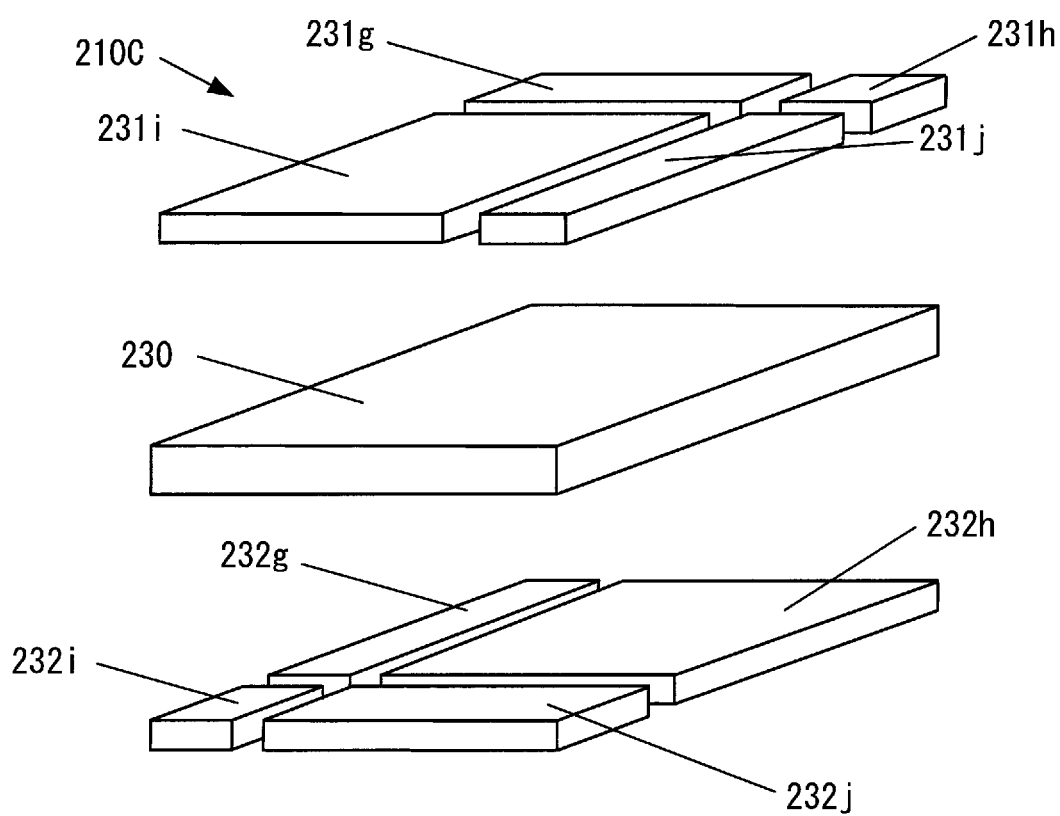
FIG. 21 is an illustration of a variation.

In addition, the first image sensor 21 may include pixels 210C each having upper partial electrodes asymmetrically separated from each other both along the row direction and also along the column direction, as shown in FIG. 21. The pixel 210C may also include lower partial electrodes asymmetrically separated from each other both along the row direction and also along the column direction. In the example presented in FIG. 21, upper partial electrodes 231*g*, 231*h*, 231*i* and 231*j* are formed at the upper surface of the organic photoelectric conversion film 230, i.e., at the surface of the organic photoelectric conversion film 230 located on the subject side, and lower partial electrodes 232*g*, 232*h*, 232*i* and 232*j* are formed at the lower surface of the organic photoelectric conversion film 230. It is to be noted that the row direction extends along the left/right direction in FIG. 21.

The position at which the upper partial electrodes 231*g* and 231*i* are separated from the upper partial electrodes 231*h* and 231*j* along the row direction is different from the position at which the lower partial electrodes 232*g* and 232*i* are separated from the lower partial electrodes 232*h* and 232*j* along the row direction. Likewise, the position at which the upper partial electrodes 231g and 231h are separated from the upper partial electrodes 231i and 231j along the column direction is different from the position at which the lower partial electrodes 232g and 232h are separated from the lower partial electrodes 232i and 232j along the column direction.

In other words, upper partial electrodes separated from one another along the row direction and along the column direction, and lower partial electrodes separated from one another along the row direction and along the column direction may be formed, with the boundary positions at which the individual upper partial electrodes are separated from one another set differently from the boundary positions at which the individual lower partial electrodes are separated from one another.

It is to be noted that while the length W1 of the first partial electrode 231a, measured along the row direction, is set equal to the length W1 of the fourth partial electrode 232b measured along the row direction, and the length W2 of the second partial electrode 231b measured along the row direction is set equal to the length W2 of the third partial electrode 232a measured along the row direction in the embodiment described earlier, the length W1 of the first partial electrode 231a measured along the row direction may be different from the length W1 of the fourth partial electrode 232b measured along the row direction and the length W2 of the second partial electrode 231b measured along the row direction may be different from the length W2 of the third partial electrode 232a measured along the row direction instead.

Likewise, while the length W3 of the first partial electrode 231c, measured along the column direction, is set equal to the length W3 of the fourth partial electrode 232d measured along the column direction, and the length W4 of the second partial electrode 231d measured along the column direction is set equal to the length W4 of the third partial electrode 232c measured along the column direction in the variation described earlier, the length W3 of the first partial electrode 231c measured along the column direction may be different from the length W3 of the fourth partial electrode 232d measured along the row direction and the length W4 of the second partial electrode 231d measured along the column direction may be different from the length W4 of the third partial electrode 232c measured along the column direction instead.

It is to be noted that the embodiment described above may be adopted in combination with any of the variations described above.

While the present invention has been described in reference to an embodiment and variations thereof, the present invention is in no way limited to the particulars of these examples. Any mode conceivable within the scope of the technical teaching of the present invention is also within the scope of the present invention.

The disclosure of the following priority application is herein Incorporated by reference:

Japanese Patent Application No. 2016-2729 filed Jan. 8, 2016

REFERENCE SIGNS LIST

1; digital camera, 10; photographic optical system, 11; image-capturing unit, 12; control unit, 12a; focus detection unit, 21; first image sensor, 22; second image sensor, 210, 210A, 210B, 210C, 220; pixel, 230; organic photoelectric conversion film, 231a, 231c, 231e; first partial electrode, 231b, 231d, 231f; second partial electrode, 232a, 232c, 232e; third partial electrode, 232b, 232d, 232f; fourth partial electrode, 251; first photoelectric conversion area, 252; second photoelectric conversion area, 253; third photoelectric conversion area, 254; fourth photoelectric conversion area, 255; fifth photoelectric conversion area, 301~308; electrode selector transistor, 311, 312; reset transistor, 313, 314; output transistor, 315, 316; row selector transistor

The invention claimed is:

1. An image sensor, comprising:
a photoelectric conversion unit that performs photoelectric conversion on light to generate an electric charge;
a first electrode and a second electrode, disposed at one side of the photoelectric conversion unit, an area of the first electrode and an area of the second electrode being different in size from one another;
a third electrode and a fourth electrode, disposed at another side of the photoelectric conversion unit, an area of the third electrode and an area of the fourth electrode being different in size from one another; and
a readout unit that reads out an electric charge generated in the photoelectric conversion unit by the first electrode, the second electrode, the third electrode and the fourth electrode.

2. The image sensor according to claim 1, wherein:
a position of a boundary between the first electrode and the second electrode is different from a position of a boundary between the third electrode and the fourth electrode, viewed from a side to which the light enters.

3. The image sensor according to claim 1, wherein:
the first electrode overlaps the entire third electrode via the photoelectric conversion unit and also overlaps part of the fourth electrode via the photoelectric conversion unit; and
the second electrode does not overlap the third electrode via the photoelectric conversion unit but overlaps part of the fourth electrode via the photoelectric conversion unit.

4. The image sensor according to claim 1, wherein:
the readout unit is able to read out from the first electrode an electric charge generated in the photoelectric conversion unit between the first electrode and the third electrode and between the first electrode and the fourth electrode, is able to read out from the first electrode or the fourth electrode an electric charge generated in the photoelectric conversion unit between the first electrode and the fourth electrode, and is able to read out from the fourth electrode an electric charge generated in the photoelectric conversion unit between the fourth electrode and the first electrode and between the fourth electrode and the second electrode.

5. The image sensor according to claim 1, wherein:
the readout unit is able to read out from the second electrode or the fourth electrode an electric charge generated in the photoelectric conversion unit between the second electrode and the fourth electrode, and is able to read out from the first electrode or the third electrode an electric charge generated in the photoelectric conversion unit between the first electrode and the third electrode.

6. The image sensor according to claim 1, wherein:
the readout unit is able to read out from the second electrode an electric charge generated in the photoelectric conversion unit between the second electrode and the fourth electrode, and is also able to read out from the first electrode an electric charge generated in the photoelectric conversion unit between the first electrode and the third electrode and between the first electrode and the fourth electrode.

7. The image sensor according to claim 6, wherein:
the readout unit is able to read out from the fourth electrode an electric charge generated in the photoelectric conversion unit between the fourth electrode and the first electrode and between the fourth electrode and the second electrode, and is also able to read out from the third electrode an electric charge generated in the photoelectric conversion unit between the first electrode and the third electrode.

8. The image sensor according to claim 1, wherein:
the first electrode and the second electrode are separated from each other by a first separation unit; and
the third electrode and the fourth electrode are separated from each other by a second separation unit disposed at a position different from a position of the first separation unit.

9. The image sensor according to claim 8, wherein:
the position of the second separation unit is different from the position of the first separation unit with respect to a direction in which the light enters.

10. The image sensor according to claim 1, wherein:
the first electrode, the photoelectric conversion unit and the third electrode are arranged in order in a direction in which the light enters;
the first electrode, the photoelectric conversion unit and a part of the fourth electrode are arranged in order in the direction in which the light enters; and
the second electrode, the photoelectric conversion unit and a part of the fourth electrode are arranged in order in the direction in which the light enters.

11. The image sensor according to claim 1, wherein:
the read out unit is able to read out an electric charge generated in the photoelectric conversion unit between the first electrode and the third electrode and between the first electrode and the fourth electrode.

12. The image sensor according to claim 1, wherein:
the read out unit is able to read out an electric charge generated in the photoelectric conversion unit between the first electrode and the fourth electrode.

13. The image sensor according to claim 1, wherein:
the read out unit is able to read out an electric charge generated in the photoelectric conversion unit between the fourth electrode and the first electrode and between the fourth electrode and the second electrode.

14. The image sensor according to claim 1, wherein:
the read out unit is able to read out an electric charge generated in the photoelectric conversion unit between the second electrode and the fourth electrode.

15. An image-capturing device, comprising:
the image sensor according to claim 1; and
a detection unit that executes focus detection based on a signal based on the electric charge read out by the read out unit.

16. The image sensor according to claim 1, wherein:
the photoelectric conversion unit is a first photoelectric conversion unit; and
the image sensor comprises:
a second photoelectric conversion unit that performs photoelectric conversion on light that has transmitted through the first photoelectric conversion unit.

17. An image-capturing device, comprising:
the image sensor according to claim 16; and
a detection unit that executes focus detection based on a signal based on the electric charge generated in the second photoelectric conversion unit.

18. The image-capturing device according to claim 17, wherein:
the detection unit executes the focus detection based on a signal based on the electric charge read out by the read out unit and the signal based on the electric charge generated in the second photoelectric conversion unit.

* * * * *